US011877460B2

(12) United States Patent
Lee et al.

(10) Patent No.: US 11,877,460 B2
(45) Date of Patent: Jan. 16, 2024

(54) PEROVSKITE OPTOELECTRONIC DEVICES AND METHOD FOR MANUFACTURING SAME

(71) Applicant: SN DISPLAY CO., LTD., Seoul (KR)

(72) Inventors: Tae-Woo Lee, Pohang-si (KR); Sanghyuk Im, Hwaseong-si (KR); Himchan Cho, Daegu (KR); Young-Hoon Kim, Daejeon (KR)

(73) Assignee: SN DISPLAY CO., LTD.

( * ) Notice: Subject to any disclaimer, the term of this patent is extended or adjusted under 35 U.S.C. 154(b) by 0 days.

(21) Appl. No.: 17/688,894

(22) Filed: Mar. 7, 2022

(65) Prior Publication Data

US 2022/0199933 A1 Jun. 23, 2022

Related U.S. Application Data

(63) Continuation of application No. 16/382,094, filed on Apr. 11, 2019, now Pat. No. 11,283,035, which is a (Continued)

(30) Foreign Application Priority Data

Nov. 6, 2014 (KR) .................. 10-2014-0153969
Nov. 6, 2015 (KR) .................. 10-2015-0156177

(51) Int. Cl.
C09K 11/06 (2006.01)
H01B 1/12 (2006.01)
(Continued)

(52) U.S. Cl.
CPC ........... H10K 50/11 (2023.02); C09D 127/18 (2013.01); C09K 11/00 (2013.01); C09K 11/025 (2013.01);
(Continued)

(58) Field of Classification Search
CPC .... H10K 85/50; H10K 85/00; H01L 31/0264; H01L 31/035218
See application file for complete search history.

(56) References Cited

U.S. PATENT DOCUMENTS 6,429,318 B1 * 8/2002 Mitzi ................ H01L 21/02282
549/3
6,777,871 B2 8/2004 Duggal et al.
(Continued)

FOREIGN PATENT DOCUMENTS

CN 104134711 A 11/2014
JP 2001060497 A 3/2001
(Continued)

OTHER PUBLICATIONS

Schmidt, Luciana et al. (2014). Nontemplate Synthesis of CH3NH3PbBr3 Perovskite Nanoparticles. Journal of the American Chemical Society. 136. 10.1021/ja4109209. (Year: 2014).*
(Continued)

Primary Examiner — Alia Sabur
(74) Attorney, Agent, or Firm — Renaissance IP Law Group LLP

(57) ABSTRACT

Provided are a perovskite optoelectronic device containing an exciton buffer layer, and a method for manufacturing the same. The optoelectronic device of the present invention comprises: an exciton buffer layer in which a first electrode, a conductive layer disposed on the first electrode and comprising a conductive material, and a surface buffer layer containing fluorine-based material having lower surface energy than the conductive material are sequentially deposited; a photoactive layer disposed on the exciton buffer layer and containing a perovskite photoactive layer; and a second electrode disposed on the photoactive layer. Accordingly, a perovskite is formed with a combined FCC and BSS crystal structure in a nanoparticle photoactive layer. The present
(Continued)

invention can also form a lamellar or layered structure in which an organic plane and an inorganic plane are alternatively deposited; and an exciton can be bound by the inorganic plane, thereby being capable of expressing high color purity.

13 Claims, 10 Drawing Sheets

Related U.S. Application Data continuation of application No. 15/524,754, filed as application No. PCT/KR2015/011964 on Nov. 6, 2015, now Pat. No. 10,263,207.

(51) Int. Cl.

| | |
|---|---|
| H01G 9/20 | (2006.01) |
| H10K 85/30 | (2023.01) |
| H10K 85/10 | (2023.01) |
| C09K 11/00 | (2006.01) |
| C09K 11/02 | (2006.01) |
| C09K 11/66 | (2006.01) |
| H01L 21/02 | (2006.01) |
| H01L 31/0264 | (2006.01) |
| H01L 31/0352 | (2006.01) |
| H01L 31/18 | (2006.01) |
| H10K 30/40 | (2023.01) |
| H10K 30/50 | (2023.01) |
| H10K 30/86 | (2023.01) |
| H10K 71/00 | (2023.01) |
| H10K 85/50 | (2023.01) |
| C09D 127/18 | (2006.01) |
| H10K 50/18 | (2023.01) |
| H10K 50/11 | (2023.01) |
| H10K 85/60 | (2023.01) |
| B82Y 30/00 | (2011.01) |
| B82Y 40/00 | (2011.01) |

(52) U.S. Cl.
CPC .......... *C09K 11/06* (2013.01); *C09K 11/664* (2013.01); *C09K 11/665* (2013.01); *H01B 1/125* (2013.01); *H01B 1/127* (2013.01); *H01G 9/2009* (2013.01); *H01L 21/02197* (2013.01); *H01L 31/0264* (2013.01); *H01L 31/035218* (2013.01); *H01L 31/18* (2013.01); *H10K 30/40* (2023.02); *H10K 30/50* (2023.02); *H10K 30/86* (2023.02); *H10K 50/18* (2023.02); *H10K 71/00* (2023.02); *H10K 85/111* (2023.02); *H10K 85/141* (2023.02); *H10K 85/30* (2023.02); *H10K 85/50* (2023.02); *B82Y 30/00* (2013.01); *B82Y 40/00* (2013.01); *C09K 2211/18* (2013.01); *C09K 2211/181* (2013.01); *C09K 2211/188* (2013.01); *H10K 85/60* (2023.02); *Y02E 10/549* (2013.01)

(56) References Cited

U.S. PATENT DOCUMENTS

| | | | |
|---|---|---|---|
| 8,109,153 | B2 | 2/2012 | Kirst |
| 9,109,153 | B2 | 8/2015 | Shin et al. |
| 10,263,207 | B2 | 4/2019 | Lee et al. |
| 11,283,035 | B2* | 3/2022 | Lee .................... H10K 85/141 |
| 2001/0033135 | A1 | 10/2001 | Duggal et al. |
| 2004/0095658 | A1 | 5/2004 | Buretea et al. |
| 2005/0061363 | A1 | 3/2005 | Ginley et al. |
| 2008/0014463 | A1 | 1/2008 | Varadarajan et al. |
| 2010/0051898 | A1 | 3/2010 | Kim et al. |
| 2010/0129529 | A1 | 5/2010 | Shin et al. |
| 2012/0298974 | A1 | 11/2012 | Lee et al. |
| 2015/0340632 | A1* | 11/2015 | Etgar .................... H10K 30/151 438/93 |
| 2016/0380136 | A1 | 12/2016 | Ning et al. |
| 2017/0233645 | A1* | 8/2017 | Zhong .................... H10K 50/81 252/301.16 |
| 2017/0324057 | A1 | 11/2017 | Friend et al. |
| 2018/0196164 | A1 | 7/2018 | Friend et al. |
| 2019/0348577 | A1 | 11/2019 | Pathak et al. |

FOREIGN PATENT DOCUMENTS

| | | |
|---|---|---|
| JP | 2003309308 A | 10/2003 |
| JP | 2007173755 A | 7/2007 |
| JP | 2008227330 A | 9/2008 |
| JP | 2009006548 A | 1/2009 |
| JP | 2010037540 A | 2/2010 |
| JP | 2010061098 A | 3/2010 |
| JP | 4863745 B2 | 1/2012 |
| JP | 2018525671 A | 9/2018 |
| KR | 20010015084 A | 2/2001 |
| KR | 20100027892 A | 3/2010 |
| KR | 20100034003 A | 3/2010 |
| KR | 20140003998 A | 1/2014 |
| KR | 20140007045 A | 1/2014 |
| KR | 20140035287 A | 3/2014 |
| WO | 2013171517 A1 | 11/2013 |

OTHER PUBLICATIONS

Gonzalez-Carrero et al., "Maximizing the emissive properties of CH3N H3PbBr3 perovskite nanoparticles", 2015, J. Mater. Chem. A, 2015,3,9187-9193, Jan. 2015.
International Search Report for PCT/KR2015/011957 dated Mar. 25, 2016.
International Search Report for PCT/KR2015/011958 dated Mar. 21, 2016.
International Search Report for PCT/KR2015/011959 dated Mar. 14, 2016.
International Search Report for PCT/KR2015/011963 dated Mar. 10, 2016.
Junwu, Zhu et al., "Solution-Phase Synthesis and Characterization of Perovskite LaCoO3 Nanocrystals via a Co-Precipitation Route", Journal of Rare Earths vol. 25, Issue 5, Oct. 2007, pp. 601-604.
Kojima, Akihiro et al., "Highly Luminescent Lead Bromide Perovskite Nanoparticles Synthesized with Porous Alumina Media", Chemistry Letters, Apr. 5, 2012, vol. 41, No. 4, p. 397-399.
Koole, Rolf et al., "Size Effects on Semiconductor Nanoparticles", Nanoparticles, Springer-Verlag Berlin Heidelberg 2014, p. 13-51.
Lim, Kyung-Geun et al., "Boosting the Power Conversion Efficiency of Perovskite Solar Cells Using Self-Organized Polymeric Hole Extraction Layers with High Work Function", Advance Materials, 2014, 26: 6461-6466.
Mali et al., "Highly stable and efficient solid-state solar cells based on methylammonium lead bromide (CH3NH3PbBr3) perovskite quantum dots", NPG Asia Materials, Jun. 9, 2015, pp. 1-9.
Mitzi, D. B. et al., "Organic-inorganic electronics", IBM Journal of Research and Development, vol. 45, No. 1, Jan. 2001, pp. 29-45.
Muthu, Chinnadurai et al., "Luminescent hybrid perovskite nanoparticles as a new platform for selective detection of 2,4,6-trinitrophenol", RSC Advances, Issue 99, Oct. 2014, vol. 4, 55908-55911.
O'Brien, Stephen et al., "Synthesis of Monodisperse Nanoparticles of Barium Titanate: Toward a Generalized Strategy of Oxide Nanoparticle Synthesis", J. Am. Chem. Soc. 2001, 123, 48, 12085-12086 Publication Date: Nov. 7, 2001.
Papavassiliou, G. C., "Synthetic Three-and Lower-Dimensional Semiconductors Based on Inorganic Units", Molecular Crystals and Liquid Crystals Science and Technology, 1996, vol. 286, pp. 231-238.
Papavassiliou, George C., "Nanocrystalline/microcrystalline materials based on lead-halide units", Journal of Materials Chemistry, 2012, vol. 22, 8271-8280.

(56) References Cited

OTHER PUBLICATIONS

Schmidt et al., "Nontemplate Synthesis of CH3NH3PbBr3 Perovskite Nanoparticles", 2014, J. Am. Chem. Soc., 2014, 136 (3), pp. 850-853, Publication Date: Jan. 3, 2014.

Schmidt, L. C. et al., "Nontemplate Synthesis of CH3NH3PbBr3 Perovskite Nanoparticles" Journal of the American Chemical Society, 2014, vol. 136. No. 3, with supplementary information, Jan. 3, 2014, 21 pages.

Smith, Andrew M. et al., "Semiconductor Nanocrystals: Structure, Properties, and Band Gap Engineering", Acc. Chem. Res. 2010, 43, 2, 190-200, Publication Date: Feb. 16, 2010.

Stoumpos, C. C. et al., "Crystal Growth of the Perovskite Semiconductor CsPbBr3: A New Material for High-Energy Radiation Detection", Crystal Growth & Design, 2013, vol. 13, No. 7, pp. 2722-2727.

Suzuki et al., "Optical Band Gap of Barium Titanate Nanoparticles Prepared by RF-plasma Chemical Vapor Deposition", 2005, Jap Journal of Applied Physics, vol. 44, No. 4A, pp. 2081-0282, published Apr. 8, 2005.

Urban, Jeffrey J. et al., "Synthesis of Single-Crystalline Perovskite Nanorods Composed of Barium Titanate and Strontium Titanate", J. Am. Chem. Soc. 2002, 124, 7, 1186-1187, Publication Date:Jan. 29, 2002.

Viteri et al., "Quantum-chemical study of excitons in tetragonal BaTiO3 and SrTiO3 crystals", 2003, Proceedings of SPIE, vol. 5122, pp. 295-302, Feb. 2003.

WIPO, International Search Report of PCT/KR2015/011963 dated Mar. 10, 2016.

Written Opinion for PCT/KR2015/011957 dated Mar. 25, 2016.
Written Opinion for PCT/KR2015/011958 dated Mar. 21, 2016.
Written Opinion for PCT/KR2015/011959 dated Mar. 14, 2016.
Written Opinion for PCT/KR2015/011963 dated Mar. 10, 2016.

Yu, Hui et al., "The Role of Chlorine in the Formation Process of 'CH3NH3PbI3-xClx' Perovskite", Advanced Functional Materials, Sep. 5, 2014, vol. 24, No. 45, pp. 7102-7108.

* cited by examiner

| Hole Injection layer | $\tau_1$/ns | $\tau_2$/ns | $\tau_{avr}$/ns |
|---|---|---|---|
| PREPARATIVE EXAMPLE 9 | 2.66 | 9.93 | 4.7 |
| PREPARATIVE EXAMPLE 8 | 0.22 | 1.12 | 0.46 |
| PREPARATIVE EXAMPLE 7 | 0.23 | 0.73 | 0.42 |
| PREPARATIVE EXAMPLE 6 | 0.22 | 0.78 | 0.39 |
| COMPARATIVE EXAMPLE 2 | 0.24 | 0.61 | 0.34 |

PEROVSKITE OPTOELECTRONIC DEVICES AND METHOD FOR MANUFACTURING SAME

TECHNICAL FIELD

The present invention relates to a light emitting device, and more particularly, to a perovskite light emitting device including an exciton buffer layer and a method for manufacturing the same.

BACKGROUND ART

The current major trend in the display market has shifted from conventional high-efficiency and high-resolution-oriented displays toward displays with vivid image qualities which aim to realize natural colors with high color purity. In this sense, organic light-emitter-based organic light emitting diode (OLED) devices have been developed rapidly and research on inorganic quantum-dot LEDs having improved color purity has been actively conducted as another alternative. However, both of the organic light-emitter and the inorganic quantum-dot light-emitter have inherent limits in terms of materials.

The conventional organic light-emitters have an advantage of high efficiency but have a drawback in that they have poor color purity due to a wide spectrum. The inorganic quantum-dot light-emitters have been known to have good color purity, but have a drawback in that their color purity may be degraded because it is difficult to uniformly control a quantum dot size due to light emission caused by a quantum size effect as emitted light is shifted toward blue. Also, the two light-emitters have a drawback in that they are very expensive. Therefore, there is a need for a novel type of organic-inorganic-hybrid light-emitter to make up for the drawbacks and keep the advantages of such organic and inorganic light-emitters.

Organic-inorganic-hybrid materials have advantages in that they have a low manufacturing cost and may be simply manufactured and applied to manufacture devices, and have both advantages of an organic material whose optical and electrical properties may be easily controlled and an inorganic material having high charge mobility and mechanical and thermal stability. Therefore, the organic-inorganic-hybrid materials have come into the spotlight in both scientific and industrial aspects.

Among these, an organic-inorganic-hybrid perovskite material has a high potential for development as a light-emitter because such a material has high color purity, its colors may be simply adjusted, and has low synthesis cost. Because the organic-inorganic-hybrid perovskite material having high color purity has a lamellar structure in which a two-dimensional (2D) plane of an inorganic substance is interposed between 2D planes of an organic substance, and has a high difference in dielectric constant between the inorganic substance and the organic substance, excitons ($\varepsilon_{organic} \approx 2.4$, and $\varepsilon_{inorganic} \approx 6.1$) are confined to an inorganic layer. Accordingly, such a configuration is formed because the organic-inorganic-hybrid perovskite material has high color purity (a full width at half maximum (FWHM)$\approx$20 nm).

A conventional material having a perovskite structure ($ABX_3$) is an inorganic metal oxide.

Such an inorganic metal oxide is generally a compound in which cations of metals (alkali metals, alkaline earth metals, transition metals, lanthanides, etc.) having different sizes, such as Ti, Sr, Ca, Cs, Ba, Y, Gd, La, Fe, Mn, etc., are positioned at the A and B sites, oxygen anions are positioned at the X site, and the metal cations at the B site are bound to the oxygen anions at the X site in the form of a corner-sharing octahedron with 6-fold coordination. Examples of the inorganic metal oxide include $SrFeO_3$, $LaMnO_3$, $CaFeO_3$, etc.

On the other hand, the organic-inorganic-hybrid perovskite has quite different compositions than the inorganic metal oxide perovskite material because it has an $ABX_3$ structure in which organic ammonium ($RNH_3$) cations are positioned at the A site and halides (Cl, Br, I) are positioned as the X site, thereby forming an organic metal halide perovskite material.

Also, the characteristics of the material vary depending on a difference in such constituent materials. Typically, because the inorganic metal oxide perovskite exhibits characteristics such as superconductivity, ferroelectricity, colossal magnetoresistance, etc., the inorganic metal oxide perovskite has been generally researched to apply it to sensors, fuel cells, memory devices, etc. For example, yttrium barium copper oxide has superconducting or insulating characteristics, depending on oxygen content.

On the other hand, because the organic-inorganic-hybrid perovskite (or metal halide perovskite) has a structure very similar to the lamellar structure in that an organic plane (or an alkali metal plane) and an inorganic plane are alternately stacked, excitons are confined in the inorganic plane. Therefore, the organic-inorganic-hybrid perovskite may essentially become an ideal light-emitter that emits light with very high color purity due to a crystalline structure itself rather than the size of the material.

When the organic-inorganic-hybrid perovskite includes a chromophore (generally having a conjugated structure) in which organic ammonium has a smaller band gap than a central metal and a halogen crystalline structure ($BX3$), light is emitted from the organic ammonium. As a result, the organic-inorganic-hybrid perovskite is not suitable as a light emitting layer because it does not emit light with high color purity and has a wider full width at half maximum of 100 nm or more in an emission spectrum. Thus, the organic-inorganic-hybrid perovskite is not highly suitable for light-emitters with high color purity, as highlighted in this patent. Therefore, to fabricate the light-emitters with high color purity, it is important for the organic ammonium to include no chromophore and emit light from an inorganic material lattice composed of a central metal-halogen element. That is, this patent has focused on the development of light-emitters with high color purity and high efficiency in which light is emitted from the inorganic material lattice. For example, Korean Patent Publication No. 10-2001-0015084 (published on Feb. 26, 2001) discloses an electroluminescence device in which a dye-containing organic-inorganic mixed material is formed in the form of a thin film rather than particles to be used as a light emitting layer, but light is not emitted from a perovskite lattice structure.

However, although the organic-inorganic-hybrid perovskite may emit light at a low temperature because it has low exciton binding energy, the organic-inorganic-hybrid perovskite has a fundamental problem in that excitons are dissociated into free charges and quenched without leading to light emission due to thermal ionization and delocalization of charge carriers at room temperature. Also, when free charges are recombined to form excitons, the excitons may be quenched by neighboring layers having high conductivity, which makes it impossible to emit light. Accordingly, it is necessary to prevent quenching of the excitons to enhance luminous efficiency and brightness of the organic-inorganic-hybrid perovskite LEDs.

DISCLOSURE

Technical Problem

To solve the above problems, it is an aspect of the present invention to provide an organic-inorganic-hybrid perovskite-based or inorganic metal halide perovskite-based light emitting device having improved luminous efficiency and brightness by introducing an exciton buffer layer to prevent excitons from being quenched in an organic-inorganic-hybrid perovskite or an inorganic metal halide perovskite material.

Technical Solution

According to one aspect of the present invention, there is provided an organic-inorganic-hybrid light emitting device including an exciton buffer layer. The light emitting device includes a first electrode, an exciton buffer layer disposed on the first electrode and including a conductive material and a fluorine-based material having lower surface energy than the conductive material, a light emitting layer including the organic-inorganic-hybrid perovskite material, and a second electrode disposed on the light emitting layer.

The exciton buffer layer may be configured so that a conductive layer including the conductive material and a surface buffer layer including the fluorine-based material having lower surface energy than the conductive material are sequentially deposited. In this case, the surface buffer layer may have a thickness of 3 nm or more. The exciton buffer layer may have a conductivity of, $10^{-7}$ S/cm to 1,000 S/cm, and the fluorine-based material may have a surface energy of 30 mN/m or less.

Also, a concentration of the fluorine-based material in a second surface of the surface buffer layer opposite to a first surface, which is closer to the conductive layer, may be lower than a concentration of the fluorine-based material in the first surface of the surface buffer layer, and a work function determined for the second surface of the conductive layer may be greater than or equal to 5.0 eV.

The fluorine-based material may be an ionomer including at least one F element, and the ionomer may be a fluorinated ionomer. The fluorine-based material may include at least one ionomer selected from the group consisting of ionomers having structures represented by the following Formulas 1 to 12:

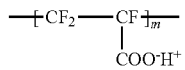

<Formula 1> wherein m is a number ranging from 1 to 10,000,000, x and y are each independently a number ranging from 0 to 10, and $M^+$ represents $Na^+$, $K^+$, $Li^+$, $H^+$, $CH_3(CH_2)-NH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

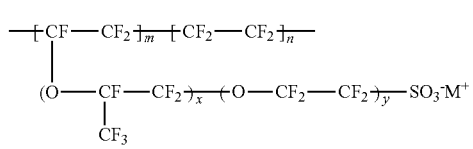

<Formula 2> wherein m is a number ranging from 1 to 10,000,000;

<Formula 3>

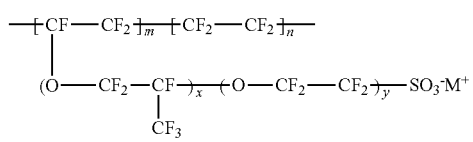

wherein m and n are $0<m\le10,000,000$ and $0\le n<10,000,000$, x and y are each independently a number ranging from 0 to 20, and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

<Formula 4> wherein m and n are $0<m\le10,000,000$ and $0\le n<10,000,000$, x and y are each independently a number ranging from 0 to 20, $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

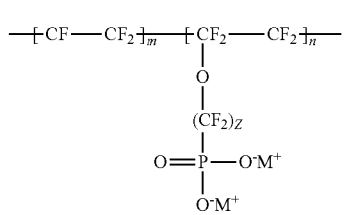

<Formula 5> wherein m and n are $0<m\le10,000,000$ and $0\le n<10,000,000$, z is a number ranging from 0 to 20, and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

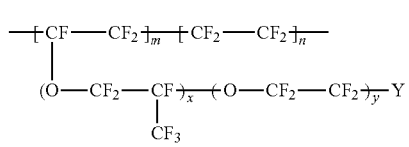

<Formula 6> wherein m and n are 0<m≤10,000,000 and 0≤n<10,000,000, x and y are each independently a number ranging from 0 to 20, Y represents one selected from —COO⁻M⁺, —SO₃⁻NHSO₂CF₃⁺, and —PO₃²⁻(M⁺)₂, and M⁺ represents Na⁺, K⁺, Li⁺, H⁺, CH₃(CH₂)—NH₃⁺ (where n is an integer ranging from 0 to 50), NH₄⁺, NH₂⁺, NHSO₂CF₃⁺, CHO⁺, C₂H₅OH⁺, CH³OH⁺, and RCHO⁺ (R represents CH₃(CH₂)ₙ—, where n is an integer ranging from 0 to 50);

<Formula 7>

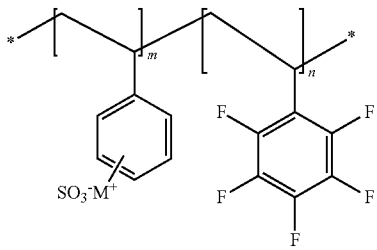

wherein m and n are 0<m≤10,000,000 and 0≤n<10,000,000, and M⁺ represents Na⁺, K⁺, Li⁺, H⁺, CH₃(CH₂)ₙNH₃⁺ (where n is an integer ranging from 0 to 50), NH₄⁺, NH₂⁺, NHSO₂CF₃⁺, CHO⁺, C₂H₅OH⁺, CH₃OH⁺, or RCHO⁺ (where R represents CH₃(CH₂)ₙ—, where n is an integer ranging from 0 to 50);

<Formula 8>

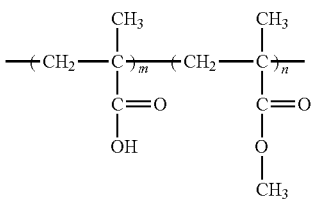

wherein m and n are 0<m≤10,000,000 and 0≤n<10,000,000;

<Formula 9>

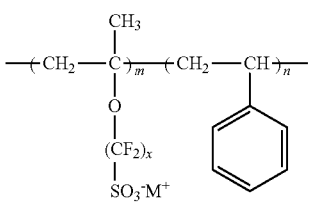

wherein m and n are 0<m≤10,000,000 and 0≤n<10,000,000, x is a number ranging from 0 to 20, and M⁺ represents Na⁺, K⁺, Li⁺, H⁺, CH₃(CH₂)ₙNH₃⁺ (where n is an integer ranging from 0 to 50), NH₄⁺, NH₂⁺, NHSO₂CF₃⁺, CHO⁺, C₂H₅OH⁺, CH₃OH⁺, or RCHO⁺ (where R represents CH₃(CH₂)ₙ—, where n is an integer ranging from 0 to 50);

<Formula 10>

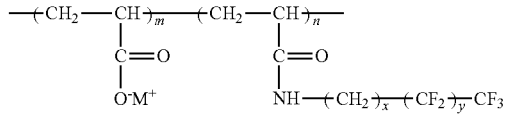

wherein m and n are 0<m≤10,000,000 and 0≤n<10,000,000, x and y are each independently a number ranging from 0 to 20, and M⁺ represents Na⁺, K⁺, Li⁺, H⁺, CH₃(CH₂)ₙNH₃⁺ (where n is an integer ranging from 0 to 50), NH₄⁺, NH₂⁺, NHSO₂CF₃⁺, CHO⁺, C₂H₅OH⁺, CH₃OH⁺, or RCHO⁺ (where R represents CH₃(CH₂)ₙ—, where n is an integer ranging from 0 to 50);

<Formula 11>

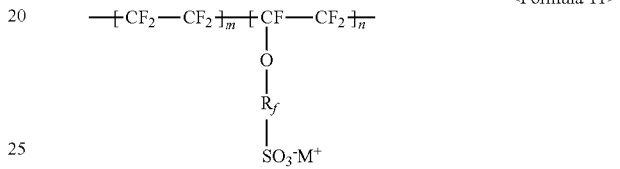

wherein m and n are 0≤m<10,000,000 and 0<n≤10,000,000, R_f=—(CF₂)_z— (where z is an integer ranging from 1 to 50, provided that 2 is excluded), —(CF₂CF₂O)_zCF₂CF₂— (where z is an integer ranging from 1 to 50), —(CF₂CF₂CF₂O)_zCF₂CF₂-(where z is an integer ranging from 1 to 50), and M⁺ represents Na⁺, K⁺, Li⁺, H⁺, CH₃(CH₂)ₙNH₃⁺ (where n is an integer ranging from 0 to 50), NH₄⁺, NH₂⁺, NHSO₂CF₃⁺, CHO⁺, C₂H₅OH⁺, CH₃OH⁺, or RCHO⁺ (where R represents CH₃(CH₂)ₙ—, where n is an integer ranging from 0 to 50); and <Formula 12>

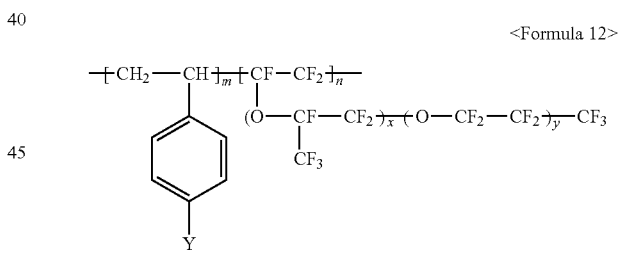

wherein m and n are 0≤m<10,000,000 and 0<n≤10,000,000, x and y are each independently a number ranging from 0 to 20, Y represents one selected from —SO₃⁻M⁺, —COO⁻M⁺, —SO₃⁻NHSO₂CF₃⁺, and —PO₃²⁻(M⁺)₂, and M⁺ represents Na⁺, K⁺, Li⁺, H⁺, CH₃(CH₂)ₙNH₃⁺ (where n is an integer ranging from 0 to 50), NH₄⁺, NH₂⁺, NHSO₂CF₃⁺, CHO⁺, C₂H₅OH⁺, CH₃OH⁺, or RCHO⁺ (where R represents CH₃(CH₂)ₙ—, where n is an integer ranging from 0 to 50).

Also, the fluorine-based material may include at least one ionomer or fluorinated oligomer selected from the group consisting of ionomers or fluorinated oligomers having structures represented by the following Formulas 13 to 19.

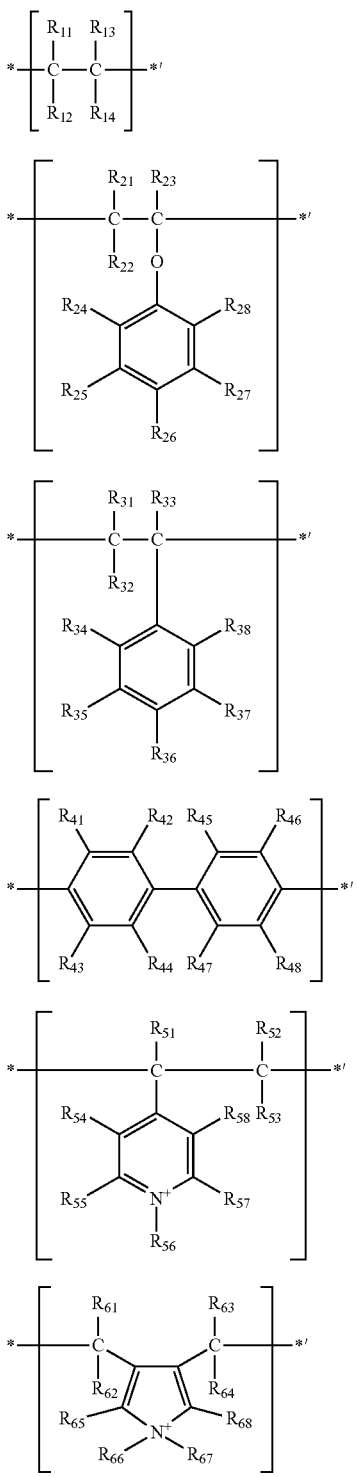

<Formula 13>

<Formula 14>

<Formula 15>

<Formula 16>

<Formula 17>

<Formula 18> wherein $R_{11}$ to $R_{14}$, $R_{21}$ to $R_{28}$, $R_{31}$ to $R_{38}$, $R_{41}$ to $R_{48}$, $R_{51}$ to $R_{58}$, and $R_{61}$ to $R_{68}$ are each independently selected from hydrogen, a $C_1$-$C_{20}$ alkyl group, a $C_1$-$C_{20}$ alkoxy group, a $C_1$-$C_{20}$ alkyl group substituted with one or more —F radicals, a $C_1$-$C_{20}$ alkoxy group substituted with one or more —F radicals, $Q_1$, —O—$(CF_2CF(CF_3)$—O$)_n$—$(CF_2)_m$-$Q_2$ (where n and m are each independently an integer ranging from 0 to 20, provided that the sum of n and m is greater than or equal to 1), and —$(OCF_2CF_2)_x$-$Q_3$ (where x is an integer ranging from 1 to 20), where $Q_1$ to $Q_3$ represent an ion group, where the ion group includes an anionic group and a cationic group, the anionic group is selected from $PO_3^{2-}$, $SO_3^-$, $COO^-$, $I^-$, $CH_3COO^-$, and $BO_2^{2-}$, the cationic group includes one or more of a metal ion and organic ion, the metal ion is selected from $Na^+$, $K^+$, $Li^+$, $Mg^{+2}$, $Zn^{+2}$, and $Al^{+3}$, and the organic ion is selected from $H^+$, $CH_3(CH_2)_{n1}NH_3^+$ (where n1 is an integer ranging from 0 to 50), $NH_4^+$, $NH_2^+$, $NHSO_2CF_3^+$, $CHO^+$, $C_2H_5OH^+$, $CH_3OH^+$, and $RCHO^+$ (where R represents $CH_3(CH_2)_{n2}-$, and n2 is an integer ranging from 0 to 50);

wherein at least one of $R_{11}$ to $R_{14}$, at least one of $R_{21}$ to $R_{28}$, at least one of $R_{31}$ to $R_{38}$, at least one of $R_{41}$ to $R_{48}$, at least one of $R_{51}$ to $R_{58}$, and at least one of $R_{61}$ to $R_{68}$ are selected from a $C_1$-$C_{20}$ alkyl group substituted with one or more —F radicals, a $C_1$-$C_{20}$ alkoxy group substituted with one or more —F radicals, —O—$(CF_2CF(CF_3)$—O$)_n$—$(CF_2)_m$-$Q_2$, and —$(OCF_2CF_2)_x$-$Q_3$; and $$X\text{-}M^f_n\text{-}M^h_m\text{-}M^a_r\text{-}G \qquad \text{<Formula 19>}$$

wherein X represents an end group;

$M^f$ represents a unit derived from a fluorinated monomer obtained by condensation reaction of perfluoropolyether alcohol, polyisocyanate, and an isocyanate-reactive non-fluorinated monomer;

$M^h$ represents a unit derived from a non-fluorinated monomer;

$M^a$ represents a unit having a silyl group represented by —Si$(Y_4)(Y_5)(Y_6)$, where $Y_4$, $Y_5$ and $Y_6$ each independently represent a substituted or unsubstituted $C_1$-$C_{20}$ alkyl group, a substituted or unsubstituted $C_6$-$C_{30}$ aryl group, or a hydrolysable substituent, provided that at least one of $Y_4$, $Y_5$ and $Y_6$ is the hydrolysable substituent;

G is a monovalent organic group including a residue of a chain transfer agent;

n is a number ranging from 1 to 100;

m is a number ranging from 0 to 100; and r is a number ranging from 0 to 100;

provided that the sum of n, m and r is at least 2.

The conductive material may include at least one selected from the group consisting of a conductive polymer, a metallic carbon nanotube, graphene, a reduced graphene oxide, metal nanowires, semiconductor nanowires, carbon nanodots, metal nanodots, and a conductive oxide, and the conductive polymer may include at least one selected from the group consisting of polythiophene, polyaniline, polypyrrole, polystyrene, sulfonated polystyrene, poly(3,4-ethylene dioxythiopene), a self-doped conductive polymer, and a derivative thereof.

At least one moiety represented by one selected from S$(Z_{100})$ and —Si$(Z_{101})(Z_{102})(Z_{103})$ (where $Z_{100}$, $Z_{101}$, $Z_{102}$, and $Z_{103}$ are each independently hydrogen, a halogen atom, a substituted or unsubstituted $C_1$-$C_{20}$ alkyl group, or a substituted or unsubstituted $C_1$-$C_{20}$ alkoxy group) is bound to the metal nanowires, the semiconductor nanowires, the carbon nanodots, or the metal nanodots.

The conductive oxide may include at least one selected from the group consisting of indium tin oxide (ITO), indium zinc oxide (IZO), $SnO_2$, and $InO_2$.

The surface buffer layer may further include at least one additive selected from the group consisting of a carbon nanotube, graphene, a reduced graphene oxide, metal nanowires, metal carbon nanodots, semiconductor quantum dots, semiconductor nanowires, and metal nanodots.

The exciton buffer layer may further include a crosslinking agent, and the crosslinking agent may include at least one functional group selected from the group consisting of an amine group (—NH$_2$), a thiol group (—SH), and a carboxyl group (—COO—). Also, the crosslinking agent may include at least one functional group selected from the group consisting of diaminoalkane, dithiol, a dicarboxylate, an ethylene glycol di(meth)acrylate derivative, a methylenebisacrylamide derivative, and divinylbenzene (DVB).

The organic-inorganic-hybrid perovskite may be in the form of particles or thin films having nanocrystals.

The organic-inorganic-hybrid perovskite may have a structure of A$_2$BX$_4$, ABX$_4$, ABX$_3$ or A$_{n-1}$B$_n$X$_{3n+1}$ (where n is an integer ranging from 2 to 6).

In this case, A is an organic ammonium material, B is a metal material, and X is a halogen element.

For example, A may be (CH$_3$NH$_3$)$_n$, ((C$_x$H$_{2x+1}$)$_n$NH$_3$)$_2$(CH$_3$NH$_3$)n, (RNH$_3$)$_2$, (C$_n$H$_{2n+1}$NH$_3$)$_2$, (CF$_3$NH$_3$), (CF$_3$NH$_3$)$_n$, ((C$_x$F$_{2x+1}$)$_n$NH$_3$)$_2$(CF$_3$NH$_3$)$_n$, ((C$_x$F$_{2x+1}$)$_n$NH$_3$)$_2$, or (C$_n$F$_{2n+1}$NH$_3$)$_2$ (where n is an integer greater than or equal to 1, and x is an integer greater than or equal to 1). Also, B may be a divalent transition metal, a rare earth metal, an alkaline earth metal, Pb, Sn, Ge, Ga, In, Al, Sb, Bi, Po, or a combination thereof. In this case, the rare earth metal may be a divalent rare earth metal. For example, the rare earth metal may be Ge, Sn, Pb, Eu, or Yb. Also, the alkaline earth metal may, for example, be Ca or Sr. Also, X may be Cl, Br, I, or a combination thereof. Further, the light emitting device may further include a plurality of alkyl halides surrounding the perovskite nanocrystals.

According to another aspect of the present invention, there is provided a method for manufacturing an organic-inorganic-hybrid perovskite light emitting device. The manufacturing method includes forming a first electrode, forming an exciton buffer layer, in which a conductive layer including a conductive material and a surface buffer layer including a fluorine-based material are sequentially deposited, on the first electrode, forming a light emitting layer, which includes an organic-inorganic-hybrid perovskite nanoparticle light-emitter including organic-inorganic-hybrid perovskite nanocrystals having a lamellar structure in which an organic substance plane and an inorganic substance plane are alternately stacked, on the exciton buffer layer, and forming a second electrode on the light emitting layer.

The organic-inorganic-hybrid perovskite may have a structure of A$_2$BX$_4$, ABX$_4$, ABX$_3$ or A$_{n-1}$B$_n$X$_{3n+1}$ (where n is an integer ranging from 2 to 6).

In this case, A is an organic ammonium material, B is a metal material, and X is a halogen element.

For example, A may be (CH$_3$NH$_3$)$_n$, ((C$_x$H$_{2x+1}$)$_n$NH$_3$)$_2$(CH$_3$NH$_3$)$_n$, (RNH$_3$)$_2$, (C$_n$H$_{2n+1}$NH$_3$)$_2$, (CF$_3$NH$_3$), (CF$_3$NH$_3$)$_n$, ((C$_x$F$_{2x+1}$)$_n$NH$_3$)$_2$(CF$_3$NH$_3$)$_n$, ((C$_x$F$_{2x+1}$)$_n$NH$_3$)$_2$, or (C$_n$F$_{2n+1}$NH$_3$)$_2$ (where n is an integer greater than or equal to 1, and x is an integer greater than or equal to 1). Also, B may be a divalent transition metal, a rare earth metal, an alkaline earth metal, Pb, Sn, Ge, Ga, In, Al, Sb, Bi, Po, or a combination thereof. In this case, the rare earth metal may be a divalent rare earth metal. For example, the rare earth metal may be Ge, Sn, Pb, Eu, or Yb. Also, the alkaline earth metal may, for example, be Ca or Sr. Further, X may be Cl, Br, I, or a combination thereof.

To solve the above problems, according to still another aspect of the present invention, there is provided a light emitting device. The light emitting device may include a first electrode, an exciton buffer layer disposed on the first electrode and including a conductive material and a fluorine-based material having lower surface energy than the conductive material, a light emitting layer disposed on the exciton buffer layer and including an inorganic metal halide perovskite material, and a second electrode disposed on the light emitting layer.

The exciton buffer layer is characterized by being configured so that a conductive layer including the conductive material and a surface buffer layer including the fluorine-based material having lower surface energy than the conductive material are sequentially deposited.

The surface buffer layer is characterized by having a thickness of 3 nm or more.

The exciton buffer layer is characterized by having a conductivity of 10$^{-7}$ S/cm to 1,000 S/cm.

The fluorine-based material is characterized by having a surface energy of 30 mN/m or less.

To solve the above problems, according to yet another aspect of the present invention, there is provided a solar cell. Such a solar cell may include a first electrode, a second electrode, an exciton buffer layer, and a photoactive layer interposed between the first electrode and the second electrode and including the aforementioned perovskite nanocrystals.

Advantageous Effects

In the perovskite light emitting device including an exciton buffer layer and the method for manufacturing the same according to the present invention, an organic-inorganic-hybrid perovskite (or organic metal halide perovskite) having a combined FCC and BCC crystalline structure in a nanoparticle light-emitter can be formed, a lamellar structure in which an organic plane (or an alkali metal plane) and an inorganic plane are alternatively deposited can be formed, and excitons can be confined to the inorganic plane, thereby expressing high color purity.

However, technical problems to be solved by the present invention are not limited to the technical problems described above, and other technical problems not disclosed herein will be clearly understood from the following description by those skilled in the art.

BEST MODE

Hereinafter, preferred embodiments of the present invention will be described in further detail with reference to the accompanying drawings in order to describe the present invention more clearly. However, the present invention is not limited to the embodiments disclosed below, but can be implemented in various forms. Throughout this specification, like numbers refer to like elements throughout the description of the figures.

In this specification, when it is assumed that a layer is referred to as being "on" another layer, it can be directly on the layer, and one or more intervening elements may also be present. Also, in this specification, the directional expressions "up," "upper (portion)," "top," and the like may be referred to as being "down," "lower (portion)," "bottom," and the like based on the criteria of the expressions. That is, the expression "spatial direction" should be understood as a relative direction, but is not restrictively interpreted as a meaning of an absolute direction.

FIGS. 1A to 1D are cross-sectional views of light emitting devices manufactured by a method for manufacturing a light emitting device according to one exemplary embodiment of the present invention. In FIGS. 1A to 1D, an organic-inorganic-hybrid perovskite is described as perovskite, but an inorganic halide perovskite may also be applied in the same manner as in the description of the organic-inorganic-hybrid perovskite.

Figure 1A:
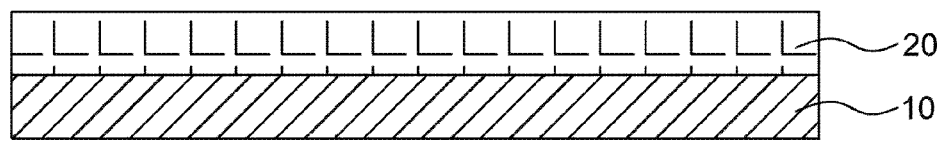
FIGS. 1A to 1D are cross-sectional views of light emitting devices manufactured by a method for manufacturing a light emitting device according to one exemplary embodiment of the present invention.

Referring to FIG. 1A, first, a first electrode 20 is formed on a substrate 10.

The aforementioned substrate 10 serves as a support of an organic light emitting device, and is composed of a material having a transparent property. Also, the aforementioned substrate 10 may be composed of all types of flexible materials and hard materials. In this case, the substrate 10 is more preferably composed of a flexible material. In particular, the material of the aforementioned substrate 10 having transparent and flexible properties may include PET, PS, PI, PVC, PVP, PE, etc.

The aforementioned first electrode 20 is an electrode into which holes are injected, and is composed of a material having a conductive property. The material constituting the aforementioned first electrode 20 may be a metal oxide, particularly preferably a transparent conductive metal oxide. For example, the aforementioned transparent conductive metal oxide may include ITO, Al-doped ZnO (AZO), Ga-doped ZnO (GZO), In/Ga-doped ZnO (IGZO), Mg-doped ZnO (MZO), Mo-doped ZnO, Al-doped MgO, Ga-doped MgO, F-doped $SnO_2$, Nb-doped $TiO_2$, $CuAlO_2$, etc.

As a deposition process for forming the aforementioned first electrode 20, physical vapor deposition (PVD), chemical vapor deposition (CVD), sputtering, pulsed laser deposition (PLD), thermal evaporation, electron beam evaporation, atomic layer deposition (ALD), and molecular beam epitaxy (MBE) may be used.

Figure 1B:
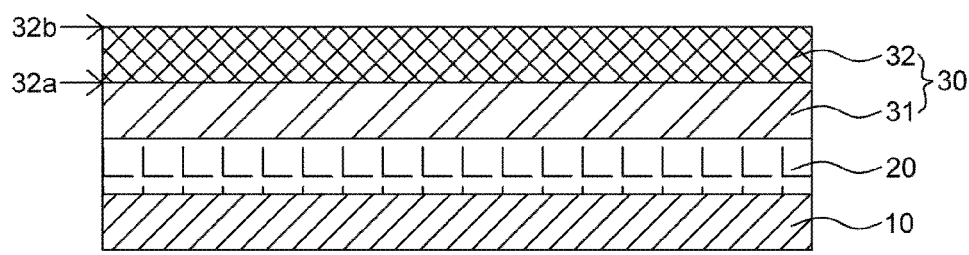

Referring to FIG. 1B, an exciton buffer layer 30 including a conductive material and a fluorine-based material having lower surface energy than the conductive material is formed on the aforementioned first electrode 20.

In this case, the aforementioned exciton buffer layer 30 may be configured so that a conductive layer 31 including the aforementioned conductive material and a surface buffer layer 32 including the aforementioned fluorine-based material are sequentially deposited, as shown in FIG. 1B.

The aforementioned conductive material may include at least one selected from the group consisting of a conductive polymer, a metallic carbon nanotube, graphene, a reduced graphene oxide, metal nanowires, semiconductor nanowires, a metal grid, metal nanodots, and a conductive oxide.

The aforementioned conductive polymer may include polythiophene, polyaniline, polypyrrole, polystyrene, sulfonated polystyrene, poly(3,4-ethylene dioxythiopene), a self-doped conductive polymer, and a derivative or combination thereof. The aforementioned derivative may mean that the conductive polymer may further include various components such as sulfonic acid, etc.

For example, the aforementioned conductive polymer may include at least one selected from the group consisting of polyaniline/dodecylbenzenesulfonic acid (Pani:DBSA; see the following formula), poly(3,4-ethylenedioxythiopene)/poly(4-styrenesulfonate) (PEDOT:PSS; see the following formula), polyaniline/Camphor sulfonic acid (Pani:CSA), and polyaniline/poly(4-styrenesulfonate) (PANI:PSS), but the present invention is not limited thereto.

For example, the conductive polymer may include polyaniline/dodecylbenzenesulfonic acid (Pani:DBSA; see the following formula), poly(3,4-ethylenedioxythiophene)/poly(4-styrenesulfonate) (PEDOT:PSS; see the following formula), polyaniline/Camphor sulfonic acid (Pani:CSA), polyaniline/poly(4-styrenesulfonate) (PANI:PSS), etc., but the present invention is not limited thereto.

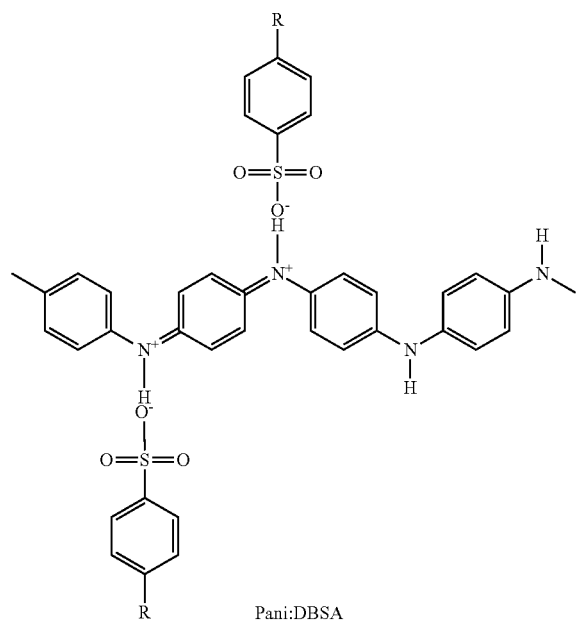

Pani:DBSA

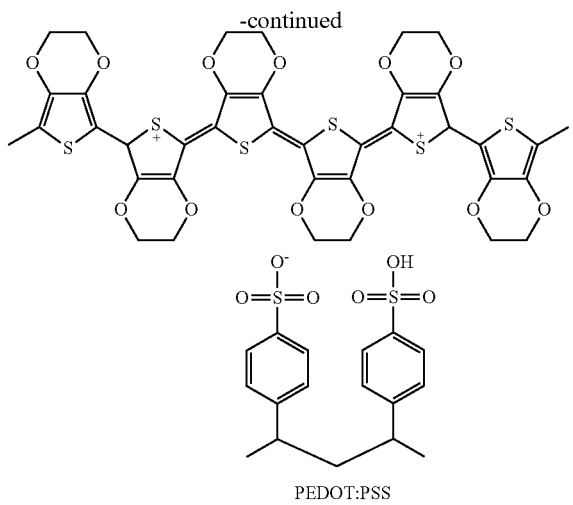

PEDOT:PSS

R may be H or a C1-C10 alkyl group.

The self-doped conductive polymer may have a degree of polymerization of 10 to 10,000,000, and may contain a repeating unit represented by the following Formula 21:

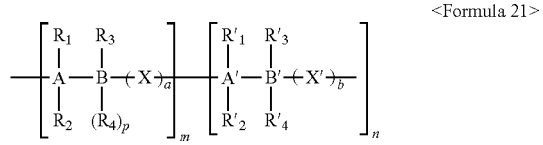

<Formula 21> wherein $0<m<10{,}000{,}000$, $0<n<10{,}000{,}000$, $0 \leq a \leq 20$, and $0 \leq b \leq 20$;

at least one of $R_1$, $R_2$, $R_3$, $R'_1$, $R'_2$, $R'_3$, and $R'_4$ includes an ion group, and A, B, A', and B' are each independently selected from C, Si, Ge, Sn, and Pb;

$R_1$, $R_2$, $R_3$, $R'_1$, $R'_2$, $R'_3$, and $R'_4$ are each independently selected from the group consisting of hydrogen, a halogen, a nitro group, a substituted or unsubstituted amino group, a cyano group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{30}$ cycloalkyl group, a substituted or unsubstituted $C_5$-$C_{30}$ heterocycloalkyl group, a substituted or unsubstituted $C_1$-$C_{30}$ alkyl ester group, and a substituted or unsubstituted $C_6$-$C_{30}$ aryl ester group, provided that a hydrogen or halogen element is selectively bound to carbon in the formula;

$R_4$ consists of a conjugated conductive polymer chain; and

X and X' are each independently selected from the group consisting of a simple bond, O, S, a substituted or unsubstituted $C_1$-$C_{30}$ alkylene group, a substituted or unsubstituted $C_1$-$C_{30}$ heteroalkylene group, a substituted or unsubstituted $C_6$-$C_{30}$ arylene group, a substituted or unsubstituted $C_6$-$C_{30}$ arylalkylene group, a substituted or unsubstituted $C_2$-$C_{30}$ heteroarylene group, a substituted or unsubstituted $C_2$-$C_{30}$ heteroarylalkylene group, a substituted or unsubstituted $C_5$-$C_{20}$ cycloalkylene group, and a substituted or unsubstituted $C_5$-$C_{30}$ heterocycloalkylene group, provided that a hydrogen or halogen element may be selectively bound to carbon in the formula.

For example, the ion group may include an anionic group selected from the group consisting of $PO_3^{2-}$, $SO_3^-$, $COO^-$, $I^-$, and $CH_3COO^-$, and a cationic group selected from the group consisting of an metal ion selected from Na+, $K^+$, $Li^+$, $Mg^{+2}$, $Zn^{+2}$, and $Al^{+3}$, and an organic ion selected from $H^+$, $NH_4^+$, $CH_3(-CH_2-)_nO^+$ (where n is a natural number ranging from 1 to 50) and making a pair with the anionic group.

For example, one or more of $R_1$, $R_2$, $R_3$, $R'_1$, $R'_2$, $R'_3$, and $R'_4$ in the self-doped conductive polymer of Formula 100 may each independently be fluorine or a group substituted with fluorine, but the present invention is not limited thereto.

For example, specific examples of the conductive polymer include the following polymers, but the present invention is not limited thereto.

<Polymer 1 (PEDOT:PSS)>

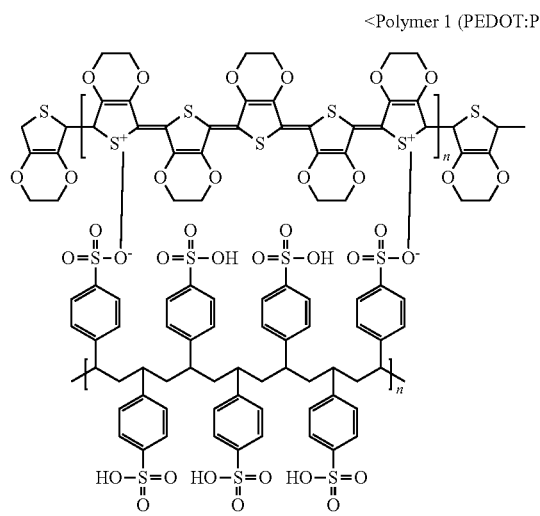

<Polymer 2 (PANI:DBSA)>

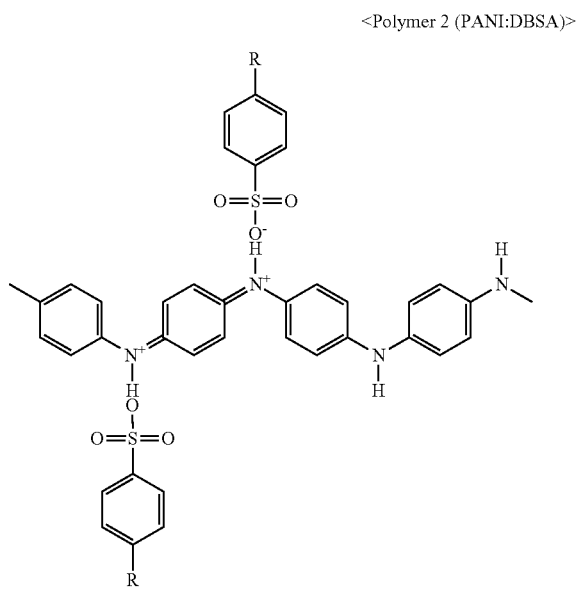

-continued
<Polymer 3>
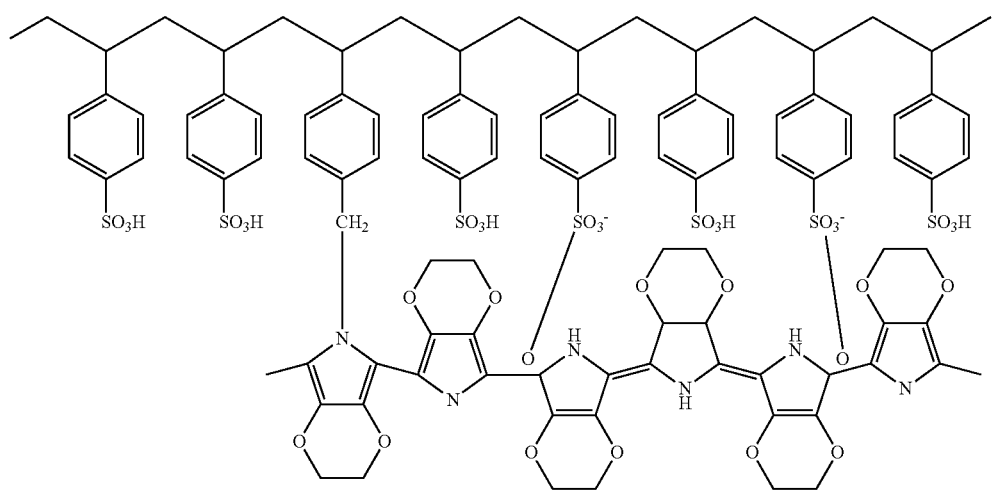
<Polymer 4 (PSS-g-PANI)>
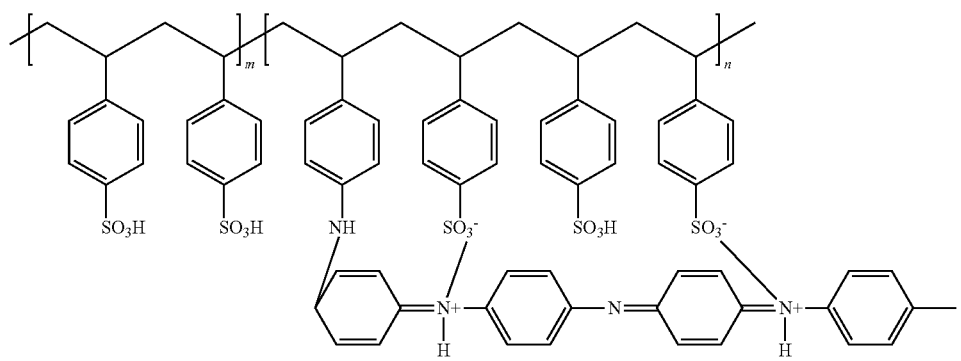
<Polymer 5>
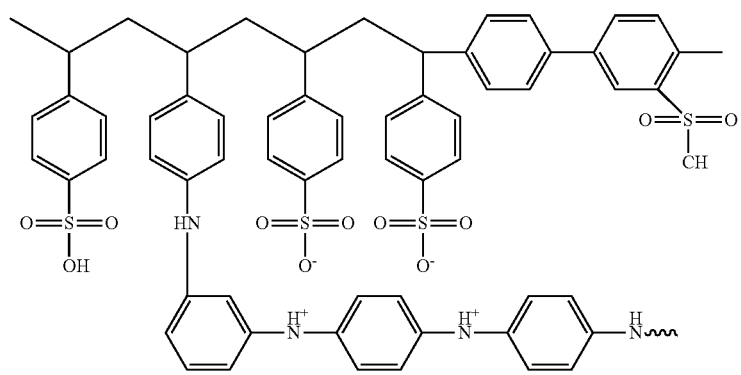
<Polymer 6>
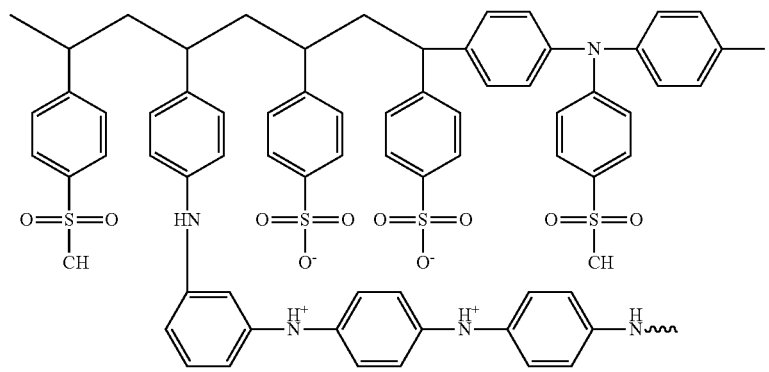

-continued
<Polymer 7>
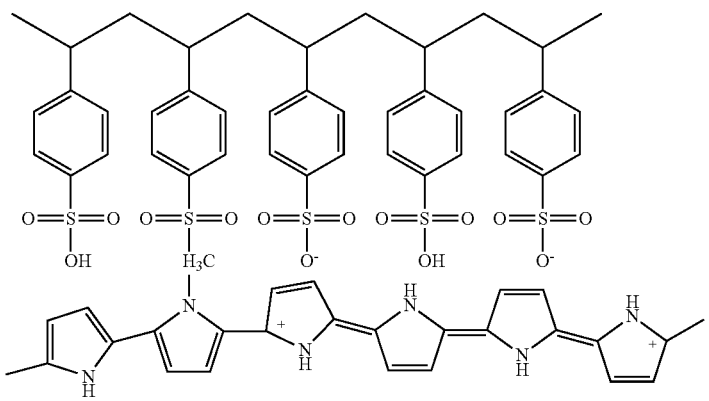
<Polymer 8>
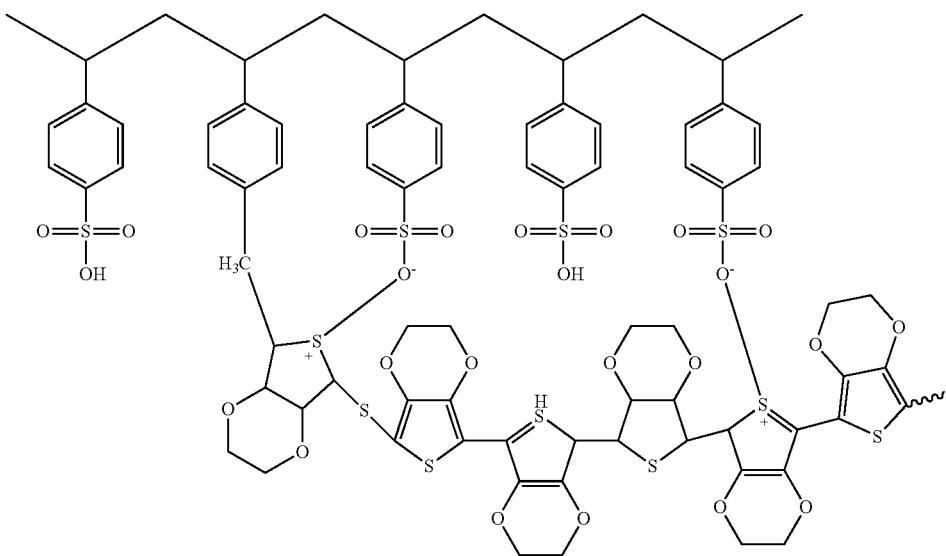
<Polymer 9 (PANI:PSS)>
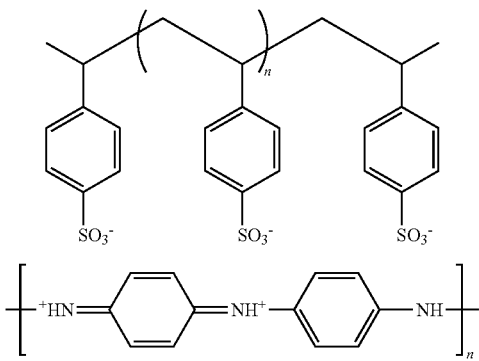
<Polymer 10>
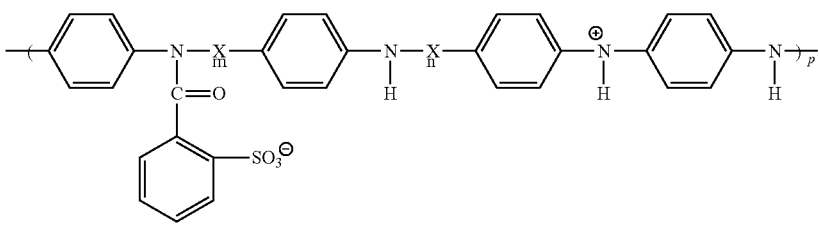

-continued
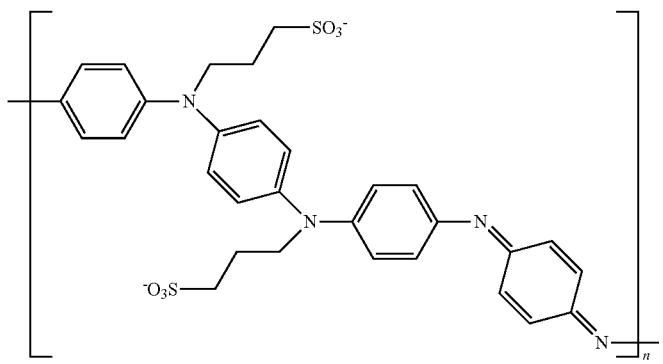
<Polymer 11>
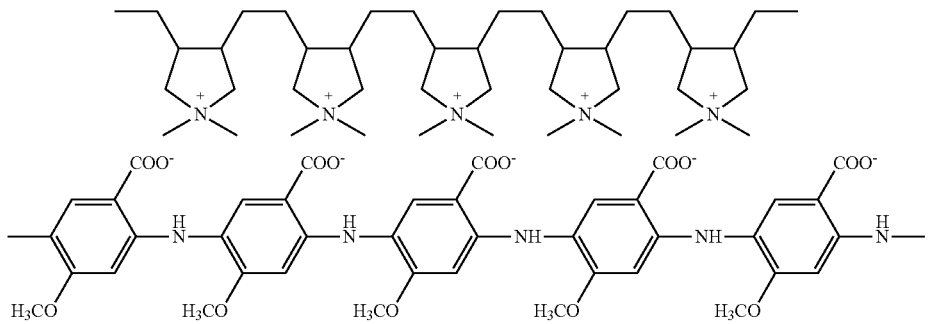
<Polymer 12>
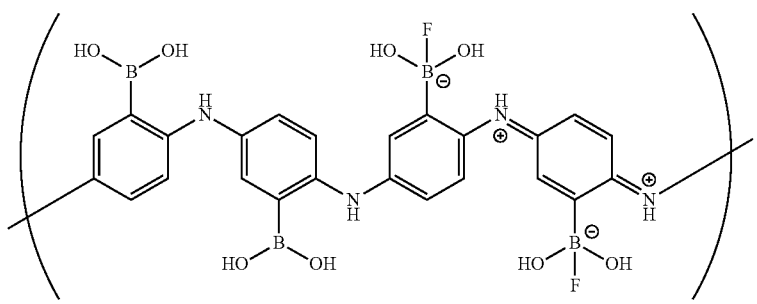
<Polymer 13>
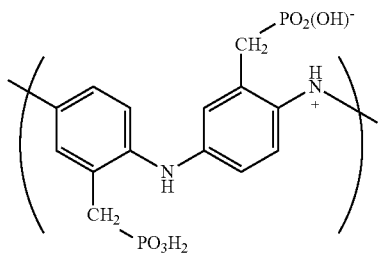
<Polymer 14>
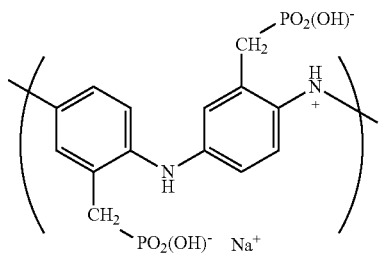
<Polymer 15>
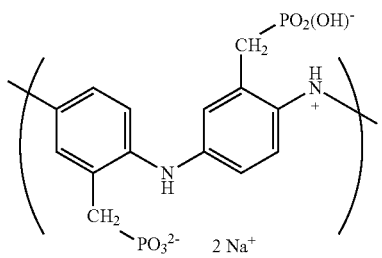
<Polymer 16>
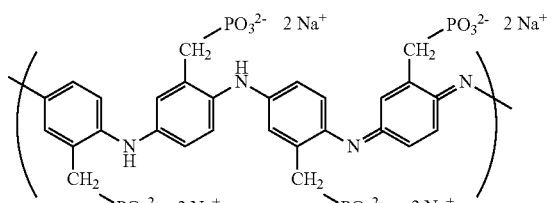
<Polymer 17>

-continued
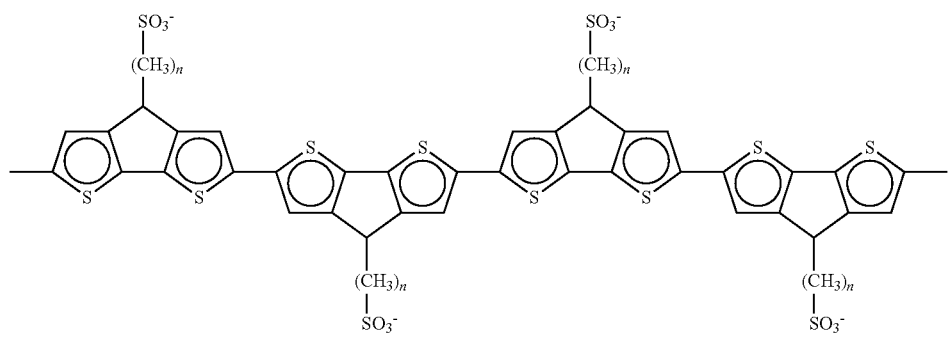
<Polymer 18>
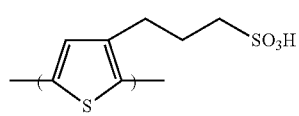
<Polymer 19>
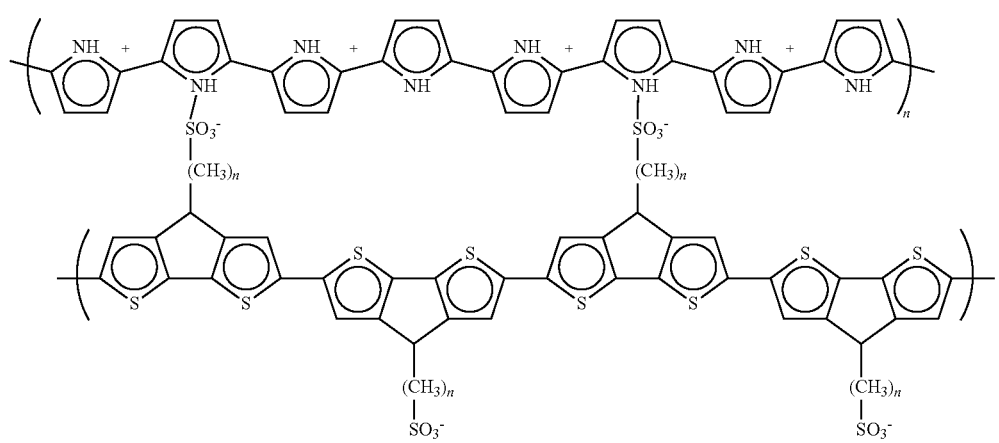
<Polymer 20>
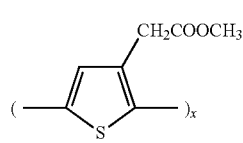
<Polymer 21>
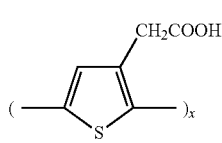
<Polymer 22>
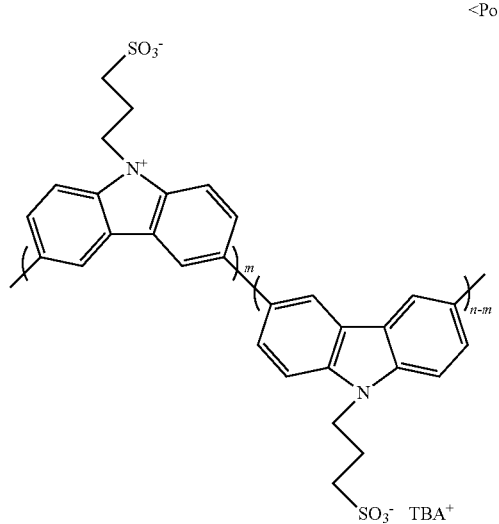
<Polymer 23>
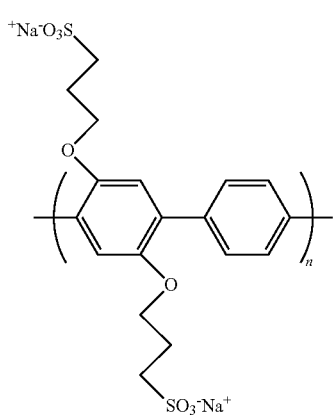
<Polymer 24>

<Polymer 25>

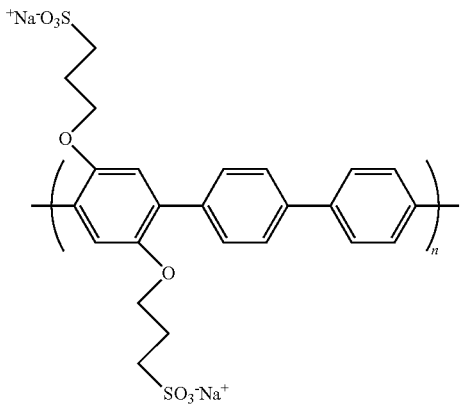

In this specification, specific examples of the unsubstituted alkyl group may include linear or branched methyl, ethyl, propyl, isobutyl, sec-butyl, tert-butyl, pentyl, isoamyl, hexyl, etc. In this case, one or more hydrogen atoms included in the aforementioned alkyl group may be substituted with a halogen atom, a hydroxyl group, a nitro group, a cyano group, a substituted or unsubstituted amino group (—$NH_2$, —NH(R), and —N(R')(R'') (where R' and R'' each independently represent an alkyl group having 1 to 10 carbon atoms), an amidino group, a hydrazine or hydrazone group, a carboxyl group, a sulfonate group, a phosphate group, a $C_1$-$C_{20}$ alkyl group, a halogenated $C_1$-$C_{20}$ alkyl group, a $C_1$-$C_{20}$ alkenyl group, a $C_1$-$C_{20}$ alkynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, or a $C_6$-$C_{20}$ heteroarylalkyl group.

In this specification, the heteroalkyl group means that one or more, preferably 1 to 5 carbon atoms in the main chain of the aforementioned alkyl group are substituted with heteroatoms such as an oxygen atom, a sulfur atom, a nitrogen atom, a phosphorus atom, etc.

In this specification, the aryl group refers to a carbocyclic aromatic system containing one or more aromatic rings. Here, the aforementioned rings may be attached or fused together in a pendant manner Specific examples of the aryl group may include aromatic groups such as phenyl, naphthyl, tetrahydronaphthyl, etc. In this case, one or more hydrogen atoms in the aforementioned aryl group may be substituted with substituents like the aforementioned alkyl group.

In this specification, the heteroaryl group refers to a cyclic aromatic system that contains 1, 2 or 3 heteroatoms selected from N, O, P, and S and has 5 to 30 carbon ring atoms as the remaining ring atoms. Here, the aforementioned rings may be attached or fused together in a pendant manner. Also, one or more hydrogen atoms in the aforementioned heteroaryl group may be substituted with substituents like the aforementioned alkyl group.

In this specification, the alkoxy group refers to a radical —O-alkyl. In this case, the alkyl is as defined above. Specific examples of the alkoxy group include methoxy, ethoxy, propoxy, isobutyloxy, sec-butyloxy, pentyloxy, isoamyloxy, hexyloxy, etc. Here, one or more hydrogen atoms in the aforementioned alkoxy group may be substituted with substituents like the aforementioned alkyl group.

As a substituent used in the present invention, a heteroalkoxy group essentially refers to the aforementioned alkoxy, except that one or more heteroatoms, for example, oxygen, sulfur or nitrogen, may be present in an alkyl chain. For example, the heteroalkoxy group includes $CH_3CH_2OCH_2CH_2O$—, $C_4H_9OCH_2CH_2OCH_2CH_2O$—, $CH_3O(CH_2CH_2O)_nH$, etc.

In this specification, the arylalkyl group means that some of hydrogen atoms in the aryl group as defined above are substituted with radicals such as a lower alkyl, for example, methyl, ethyl, propyl, etc. For example, the arylalkyl group includes benzyl, phenylethyl, etc. One or more hydrogen atoms in the aforementioned arylalkyl group may be substituted with substituents like the aforementioned alkyl group.

In this specification, the heteroarylalkyl group means that some of hydrogen atoms in the heteroaryl group are substituted with a lower alkyl group. Here, a definition of the heteroaryl in the heteroarylalkyl group is as described above. One or more hydrogen atoms in the aforementioned heteroarylalkyl group may be substituted with substituents like the aforementioned alkyl group.

In this specification, the aryloxy group refers to a radical —O-aryl. In this case, the aryl is as defined above. Specific examples of the aryloxy group include phenoxy, naphthoxy, anthracenyloxy, phenanthrenyloxy, fluorenyloxy, indenyloxy, etc. In this case, one or more hydrogen atoms in the aryloxy group may be substituted with substituents like the aforementioned alkyl group.

In this specification, the heteroaryloxy group refers to a radical —O-heteroaryl. In this case, the heteroaryl is as defined above.

In this specification, specific examples of the heteroaryloxy group include a benzyloxy group, a phenylethyloxy group, etc. In this case, one or more hydrogen atoms in the heteroaryloxy group may be substituted with substituents like the aforementioned alkyl group.

In this specification, the cycloalkyl group refers to a monovalent monocyclic system having 5 to 30 carbon atoms. One or more hydrogen atoms in the aforementioned cycloalkyl group may be substituted with substituents like the aforementioned alkyl group.

In this specification, the heterocycloalkyl group refers to a monovalent monocyclic system that contains 1, 2 or 3 heteroatoms selected from N, O, P, and S and has 5 to 30 carbon ring atoms as the remaining ring atoms. Here, one or more hydrogen atoms in the aforementioned cycloalkyl group may be substituted with substituents like the aforementioned alkyl group.

In this specification, the alkyl ester group refers to a functional group to which an alkyl group and an ester group are bound. In this case, the alkyl group is as defined above.

In this specification, the heteroalkyl ester group refers to a functional group to which a heteroalkyl group and an ester group are bound. In this case, the aforementioned heteroalkyl group is as defined above.

In this specification, the aryl ester group refers to a functional group to which an aryl group and an ester group are bound. In this case, the aryl group is as defined above.

In this specification, the heteroaryl ester group refers to a functional group to which a heteroaryl group and an ester group are bound. In this case, the heteroaryl group is as defined above.

The amino group used in the present invention refers to $-NH_2$, $-NH(R)$ or $-N(R')(R'')$, where R' and R'' each independently represent an alkyl group having 1 to 10 carbon atoms.

In this specification, the halogen is fluorine, chlorine, bromine, iodine, or astatine. Among these, fluorine is particularly preferred.

The aforementioned metallic carbon nanotube may be a material composed of a purified metallic carbon nanotube itself or a carbon nanotube in which metal particles (for example, Ag, Au, Cu, Pt particles, etc.) are attached to inner and/or outer walls of the carbon nanotube.

The aforementioned graphene may have a structure of single-layer graphene having a thickness of approximately 0.34 nm, a few layer graphene having a structure in which 2 to 10 sheets of the single-layer graphene are deposited, or multilayer graphene having a structure in which a larger number of sheets of the single-layer graphene than the few layer graphene are deposited.

The aforementioned metal nanowires and the semiconductor nanowires may, for example, be selected from Ag, Au, Cu, Pt, nickel silicide ($NiSi_x$) nanowires, and composite nanowires of two or more types thereof (for example, an alloy, a core-shell structure, etc.), but the present invention is not limited thereto.

Also, the aforementioned semiconductor nanowires may be selected from Si nanowires doped with Si, Ge, B or N, Ge nanowires doped with B or N, and composites of two or more types thereof (for example, an alloy, a core-shell structure, etc.), but the present invention is not limited thereto.

The aforementioned metal nanowires and semiconductor nanowires may have a diameter of 5 nm to 100 nm and a length of 500 nm to 100 μm. In this case, the diameter and length of the metal nanowires and semiconductor nanowires may be variously selected depending on a method for manufacturing the aforementioned metal nanowires and semiconductor nanowires.

The aforementioned metal grid is obtained by forming metallic lines which cross each other in the form of net using Ag, Au, Cu, Al, Pt and an alloy thereof. In this case, the metal grid may have a line width of 100 nm to 100 μm, but a length of the metal grid is not limited. The aforementioned metal grid may be formed to extrude from a first electrode, or may be inserted into the first electrode so that the metal grid can be formed in a recessed shape.

The aforementioned metal nanodots may be selected Ag, Au, Cu, Pt, and composite nanodots of two or more types thereof (for example, an alloy, a core-shell structure, etc.), but the present invention is not limited thereto.

At least one moiety (where the aforementioned $Z_{100}$, $Z_{101}$, $Z_{102}$, and $Z_{103}$ each independently represent hydrogen, a halogen atom, a substituted or unsubstituted $C_1$-$C_{20}$ alkyl group, or a substituted or unsubstituted $C_1$-$C_{20}$ alkoxy group) represented by one selected from $-S(Z_{100})$ and $-Si(Z_{101})(Z_{102})(Z_{103})$ may be bound to surfaces of the aforementioned metal nanowires, semiconductor nanowires, and metal nanodots. The at least one moiety represented by one selected from the aforementioned $-S(Z_{100})$ and $-Si(Z_{101})(Z_{102})(Z_{103})$ is a self-assembled moiety. In this case, a binding force between the metal nanowires, the semiconductor nanowires and the metal nanodots or a binding force between the metal nanowires, semiconductor nanowires and metal nanodots and the first electrode 210 through the aforementioned moiety may be enhanced, resulting in further improved electrical characteristics and mechanical strength.

The aforementioned conductive oxide may be one selected from indium tin oxide (ITO), indium zinc oxide (IZO), $SnO_2$, and $InO_2$.

A process of forming the aforementioned conductive layer 31 on the aforementioned first electrode 20 may be performed using a spin-coating, casting, Langmuir-Blodgett (LB), ink-jet printing, nozzle printing, slot-die coating, doctor-blade coating, screen printing, dip coating, gravure printing, reverse-offset printing, physical transfer, spray coating, chemical vapor deposition, or thermal evaporation process.

Also, the conductive layer 31 may be formed by mixing the aforementioned conductive material with a solvent to prepare a mixed solution, applying the mixed solution onto the aforementioned first electrode 10 and thermally treating the mixed solution to remove the aforementioned solvent. In this case, the aforementioned solvent may be a polar solvent. In this case, the polar solvent may, for example, include at least one selected from the group consisting of water, an alcohol (methanol, ethanol, n-propanol, 2-propanol, n-butanol, etc.), formic acid, nitromethane, acetic acid, ethylene glycol, glycerol, n-methyl-2-pyrrolidone (NMP), N,N-dimethyl acetamide, dimethyl formamide (DMF), dimethyl sulfoxide (DMSO), tetrahydrofuran (THF), ethyl acetate (EtOAc), acetone, and acetonitrile (MeCN).

When the aforementioned conductive layer 31 includes a metallic carbon nanotube, the metallic carbon nanotube may be grown on the aforementioned first electrode 20, or the carbon nanotube dispersed in a solvent may be formed using a solution-based printing method (e.g., a spray coating, spin-coating, dip coating, gravure coating, reverse-offset coating, screen printing, or slot-die coating method).

When the aforementioned conductive layer 31 includes a metallic grid, the metallic grid may be formed by depositing a metal on the aforementioned first electrode 20 under vacuum to form a metal film and patterning the first electrode 20 in various network shapes using photolithography, or by dispersing a metal precursor or metal particles in a solvent and subjecting the dispersion to a printing method (e.g., a spray coating, spin-coating, dip coating, gravure coating, reverse-offset coating, screen printing, or slot-die coating method).

The aforementioned conductive layer 31 may serve to improve conductivity in the aforementioned exciton buffer layer 30, and may additionally serve to regulate scattering, reflection and absorption of light to improve optical extraction or give flexibility to improve mechanical strength.

The aforementioned surface buffer layer 32 includes a fluorine-based material. In this case, the aforementioned fluorine-based material is preferably a fluorine-based material having lower surface energy than the aforementioned conductive material. In this case, the fluorine-based material may have a surface energy of 30 mN/m or less.

Also, the aforementioned fluorine-based material may have a higher hydrophobic property than the aforementioned conductive polymer.

In this case, a concentration of the aforementioned fluorine-based material in a second surface 32b of the aforementioned surface buffer layer 32 opposite to a first surface 32a, which is closer to the aforementioned conductive layer 31, may be lower than a concentration of the fluorine-based material in the first surface 32a of the surface buffer layer 32.

Therefore, the second surface 32b of the aforementioned surface buffer layer 32 may have a work function of 5.0 eV or more. By way of one example, the work function measured for the second surface 32b of the aforementioned surface buffer layer 32 may be in a range of 5.0 eV to 6.5 eV, but the present invention is not limited thereto.

The aforementioned fluorine-based material may be a perfluorinated ionomer or a fluorinated ionomer including at least one F element. In particular, when the aforementioned fluorine-based material is a fluorinated ionomer, a thick buffer layer may be formed, and phase separation between the conductive layer 31 and the surface buffer layer 32 may be prevented, which makes it possible to form the exciton buffer layer 30 more uniformly.

The aforementioned fluorine-based material may include at least one ionomer selected from the group consisting of ionomers having structures represented by the following Formulas 1 to 12:

<Formula 1>

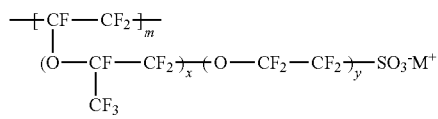

wherein m is a number ranging from 1 to 10,000,000, x and y are each independently a number ranging from 0 to 10, and $M^+$ represents $Na^+$, $K^+$, $Li^+$, $H^+$, $CH_3(CH_2)-NH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

<Formula 2>

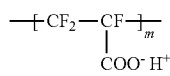

wherein m is a number ranging from 1 to 10,000,000;

<Formula 3>

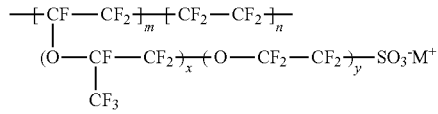

wherein m and n are $0<m\leq10,000,000$ and $0\leq n<10,000,000$, x and y are each independently a number ranging from 0 to 20, and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

<Formula 4>

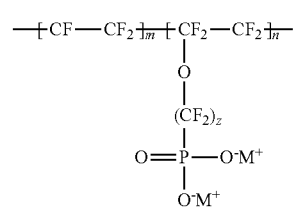

wherein m and n are $0<m\leq10,000,000$ and $0\leq n<10,000,000$, x and y are each independently a number ranging from 0 to 20, $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

<Formula 5>

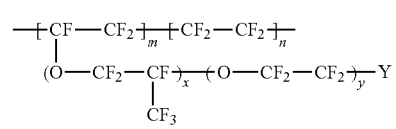

wherein m and n are $0<m\leq10,000,000$ and $0\leq n<10,000,000$, z is a number ranging from 0 to 20, and $M^+$ represents $Na^+$, $K^+$, $Li^+$, $H^+$, $CH_3(CH_2)-NH_3+$(where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

<Formula 6>

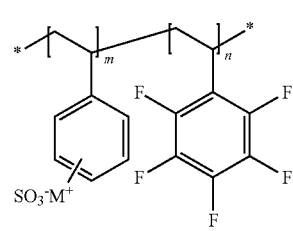

wherein m and n are $0<m\leq10,000,000$ and $0\leq n<10,000,000$, x and y are each independently a number ranging from 0 to 20, Y represents one selected from $-COO^-M^+$, $-SO_3^-$ $NHSO_2CF_3^+$, and $-PO_3^{2-}(M^+)$, and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, CHOP, $C_2H_5OH^+$, $CH_3OH^+$, and $RCHO^+$ (R represents $CH_3(CH_2)_n-$, where n is an integer ranging from 0 to 50);

<Formula 7> wherein m and n are $0<m\leq10,000,000$ and $0\leq n<10,000,000$, and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n-$, where n is an integer ranging from 0 to 50);

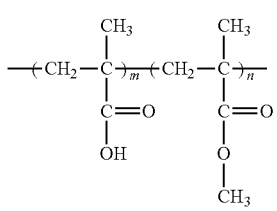

<Formula 8> wherein m and n are 0<m≤10,000,000 and 0≤n<10,000,000;

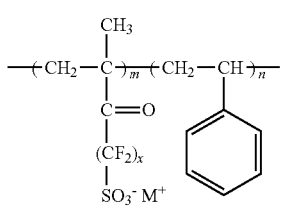

<Formula 9> wherein m and n are 0<m≤10,000,000 and 0≤n<10,000,000, x is a number ranging from 0 to 20, and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n$—, where n is an integer ranging from 0 to 50);

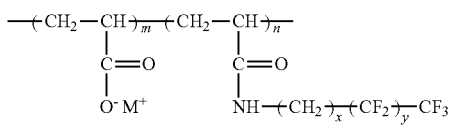

<Formula 10> wherein m and n are 0<m≤10,000,000 and 0≤n<10,000,000, x and y are each independently a number ranging from 0 to 20, and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n$—, where n is an integer ranging from 0 to 50);

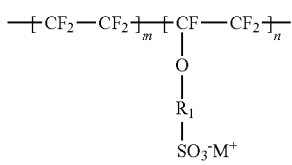

<Formula 11> wherein m and n are 0≤m<10,000,000 and 0<n≤10,000,000, $R_f$—$(CF_2)_z$— (where z is an integer ranging from 1 to 50, provided that 2 is excluded), —$(CF_2CF_2O)_zCF_2CF_2$— (where z is an integer ranging from 1 to 50), —$(CF_2CF_2CF_2O)CF_2CF_2$-(where z is an integer ranging from 1 to 50), and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n$—, where n is an integer ranging from 0 to 50); and

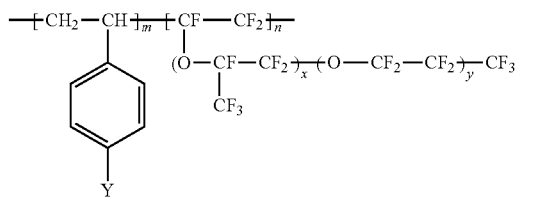

<Formula 12> wherein m and n are 0≤m<10,000,000 and 0<n≤10,000,000, x and y are each independently a number ranging from 0 to 20, Y represents one selected from —$SO_3^-M^+$, $COO^-M^+$, —$SO_3^-NHSO_2CF_3^+$, and —$PO_3^{2-}(M^+)_2$, and $M^+$ represents $Na^+$, $K^+$, $Li^+$, $H^+$, $CH_3(CH_2)_nNH_3^+$ (where n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (where R represents $CH_3(CH_2)_n$—, where n is an integer ranging from 0 to 50).

Also, the aforementioned fluorine-based material may include at least one ionomer or fluorinated oligomer selected from the group consisting of ionomers or fluorinated oligomers having structures represented by the following Formulas 13 to 19:

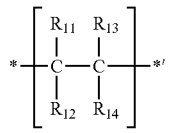

<Formula 13>

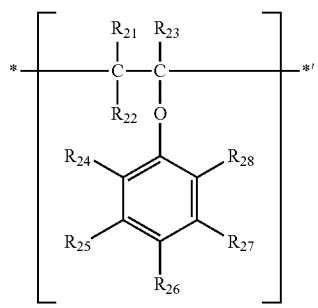

<Formula 14>

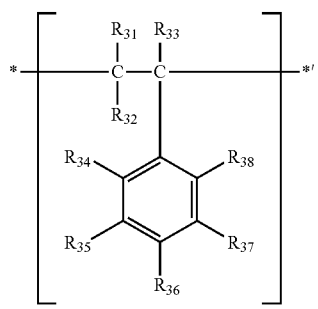

<Formula 15>

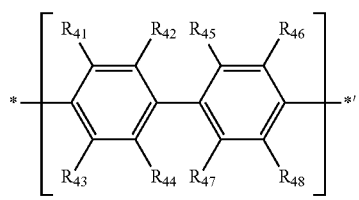

<Formula 16>

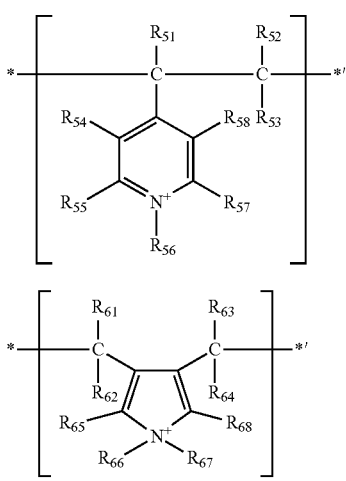

<Formula 17>

<Formula 18> wherein $R_{11}$ to $R_{14}$, $R_{21}$ to $R_{28}$, $R_{31}$ to $R_{38}$, $R_{41}$ to $R_{48}$, $R_{51}$ to $R_{58}$, and $R_{61}$ to $R_{68}$ are each independently selected from hydrogen, —F, a $C_1$-$C_{20}$ alkyl group, a $C_1$-$C_{20}$ alkoxy group, a $C_1$-$C_{20}$ alkyl group substituted with one or more —F radicals, a $C_1$-$C_{20}$ alkoxy group substituted with one or more —F radicals, $Q_1$, —O—$(CF_2CF(CF_3)$—O$)_n$—$(CF_2)_m$-$Q_2$ (where n and m are each independently an integer ranging from 0 to 20, provided that the sum of n and m is greater than or equal to 1), and —$(OCF_2CF_2)_x$-$Q_3$ (where x is an integer ranging from 1 to 20), where $Q_1$ to $Q_3$ represent an ion group, where the aforementioned ion group includes an anionic group and a cationic group, the aforementioned anionic group is selected from $PO_3^{2-}$, $SO_3^-$, $COO^-$, $I^-$, $CH_3COO^-$, and $BO_2^{2-}$, the aforementioned cationic group includes one or more of a metal ion and organic ion, the aforementioned metal ion is selected from $Na^+$, $K^+$, $Li^+$, $Mg^{+2}$, $Zn^{+2}$, and $Al^{+3}$, and the aforementioned organic ion is selected from $H^+$, $CH_3(CH_2)_{n1}NH_3^+$ (where n1 is an integer ranging from 0 to 50), $NH_4^+$, $NH_2^+$, $NHSO_2CF_3^+$, $CHO^+$, $C_2H_5OH^+$, $CH_3OH^+$, and $RCHO^+$ (where R represents $CH_3(CH_2)_{n2}$—, and n2 is an integer ranging from 0 to 50);

wherein at least one of $R_{11}$ to $R_{14}$, at least one of $R_{21}$ to $R_{28}$, at least one of $R_{31}$ to $R_{38}$, at least one of $R_{41}$ to $R_{48}$, at least one of $R_{51}$ to $R_{58}$, and at least one of $R_{61}$ to $R_{68}$ are selected from —F, a $C_1$-$C_{20}$ alkyl group substituted with one or more —F radicals, a $C_1$-$C_{20}$ alkoxy group substituted with one or more —F radicals, —O—$(CF_2CF(CF_3)$—O$)_n$—$(CF_2)_m$-$Q_2$, and —$(OCF_2CF_2)_x$-$Q_3$; and $$X\text{-}M^f_n\text{-}M^h_m\text{-}M^a_r\text{-}G$$  <Formula 19> wherein X represents an end group;

$M^f$ represents a unit derived from a fluorinated monomer obtained by condensation reaction of perfluoropolyether alcohol, polyisocyanate, and an isocyanate-reactive non-fluorinated monomer;

$M^h$ represents a unit derived from a non-fluorinated monomer;

$M^a$ represents a unit having a silyl group represented by —Si($Y_4$)($Y_5$)($Y_6$), where $Y_4$, $Y_5$ and $Y_6$ each independently represent a substituted or unsubstituted $C_1$-$C_{20}$ alkyl group, a substituted or unsubstituted $C_6$-$C_{30}$ aryl group, or a hydrolysable substituent, provided that at least one of $Y_4$, $Y_5$ and $Y_6$ is the aforementioned hydrolysable substituent;

G is a monovalent organic group including a residue of a chain transfer agent;

n is a number ranging from 1 to 100;

m is a number ranging from 0 to 100; and r is a number ranging from 0 to 100;

provided that the sum of n, m and r is at least 2.

The aforementioned surface buffer layer 32 may have a thickness of 20 nm to 500 nm, for example, a thickness of 50 nm to 200 nm. When the thickness of the aforementioned surface buffer layer 32 satisfies this thickness range as described above, excellent work function characteristics, transmittance and flexible characteristics may be provided.

The aforementioned surface buffer layer 32 may be formed by applying a mixed solution including the aforementioned fluorine-based material and a solvent onto the aforementioned conductive layer 31 and thermally treating the mixed solution.

The exciton buffer layer 30 thus formed may have a thickness of 50 nm to 1,000 nm. Conductivity may be improved as the aforementioned conductive layer 31 is formed, and surface energy may be simultaneously reduced as the aforementioned surface buffer layer 32 is formed, thereby maximizing light emission characteristics.

The aforementioned surface buffer layer 32 may further include at least one additive selected from the group consisting of a carbon nanotube, graphene, a reduced graphene oxide, metal nanowires, metal carbon nanodots, semiconductor quantum dots, semiconductor nanowires, and metal nanodots. When the surface buffer layer 32 further includes the aforementioned additive, improvement of conductivity of the aforementioned exciton buffer layer 30 may be maximized.

Also, the aforementioned surface buffer layer 32 may further include a crosslinking agent including a bis(phenyl azide)-based material. When the aforementioned surface buffer layer 32 further includes the aforementioned crosslinking agent, compositional separation according to the time and device driving may be prevented. Accordingly, the resistance and work function of the aforementioned exciton buffer layer 30 may be reduced to improve stability and reproducibility of the light emitting device.

The aforementioned bis(phenyl azide)-based material may be a bis(phenyl azide)-based material represented by the following Formula 20.

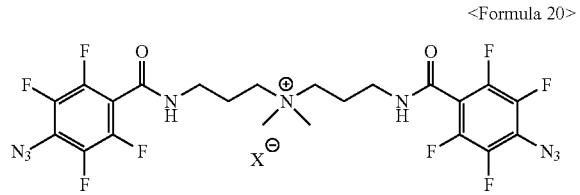

<Formula 20>

A process of forming the aforementioned surface buffer layer 32 on the aforementioned conductive layer 31 may be performed using a spin-coating, casting, Langmuir-Blodgett (LB), ink-jet printing, nozzle printing, slot-die coating, doctor-blade coating, screen printing, dip coating, gravure printing, reverse-offset printing, physical transfer, spray coating, chemical vapor deposition, or thermal evaporation process.

However, in a process of forming the aforementioned exciton buffer layer 30, the exciton buffer layer 30 may be formed by sequentially depositing the aforementioned conductive layer 31 and the surface buffer layer 32, as described above, or by mixing the aforementioned conductive material and the aforementioned fluorine-based material in a solvent to prepare a mixed solution, applying the aforementioned mixed solution onto the aforementioned first electrode and thermally treating the first electrode.

In this case, as the aforementioned mixed solution is thermally treated, the conductive layer 31 and the surface buffer layer 32 are sequentially formed on the aforementioned first electrode 20 through self-assembly. As a result, the process may be simplified.

The aforementioned fluorine-based material may be a material having a solubility of 90% or more, for example, a solubility of 95% or more with respect to the polar solvent. Examples of the aforementioned polar solvent may include water, an alcohol (methanol, ethanol, n-propanol, 2-propanol, n-butanol, etc.), ethylene glycol, glycerol, dimethyl formamide (DMF), dimethyl sulfoxide (DMSO), acetone, etc., but the present invention is not limited thereto.

The aforementioned exciton buffer layer 30 may further include a crosslinking agent.

The crosslinking agent may be added to the aforementioned exciton buffer layer 30 to prevent the phase separation of constituent materials from occurring according to the time and device driving. Also, a decline in efficiency of the exciton buffer layer 30 may be prevented using a solvent to form the aforementioned surface buffer layer 32. Thus, device stability and reproducibility may be improved.

The aforementioned crosslinking agent may include at least one functional group selected from the group consisting of an amine group (—$NH_2$), a thiol group (—SH), and a carboxyl group (—COO—).

Also, the aforementioned crosslinking agent may include at least one selected from the group consisting of a bis(phenyl azide)-based material, a diaminoalkane-based material, a dithiol-based material, a dicarboxylate, an ethylene glycol di(meth)acrylate derivative, a methylenebisacrylamide derivative, and divinylbenzene (DVB).

A hole transport layer (not shown) may be formed on the aforementioned exciton buffer layer 30. The aforementioned hole transport layer may be formed using a method optionally selected from various known methods such as a vacuum deposition method, a spin-coating method, a casting method, an LB (Langmuir Blodgett) method, etc. In this case, when the vacuum deposition method is chosen, the deposition conditions vary depending on a target compound, a desired structure of a layer, and thermal characteristics. However, the deposition conditions may, for example, be chosen within a deposition temperature of 100° C. to 500° C., a degree of vacuum of $10^{-10}$ to $10^{-3}$ Torr, and a deposition rate of 0.01 Å/sec to 100 Å/sec. Meanwhile, when the spin-coating method is chosen, the coating conditions vary depending on a target compound, a desired structure of a layer, and thermal characteristics. However, the coating conditions may, for example, be chosen within a coating speed of 2,000 rpm to 5,000 rpm and a thermal treatment temperature of 80° C. to 200° C. (a thermal treatment temperature used to remove a solvent after coating).

The hole transport layer material may be selected from materials capable of promoting the transfer of holes, compared to the injection of the holes. The aforementioned hole transport layer may be formed using known hole transport materials. For example, the hole transport layer material may be an amine-based material having an aromatic condensed ring, or a triphenyl amine-based material.

More specifically, examples of the aforementioned hole transport material may include 1,3-bis(carbazol-9-yl)benzene (MCP), 1,3,5-tris(carbazol-9-yl)benzene (TCP), 4,4',4"-tris(carbazol-9-yetriphenylamine (TCTA), 4,4'-bis(carbazol-9-yl)biphenyl (CBP), N,N'-bis(naphthalen-1-yl)-N,N'-bis(phenyl)-benzidine (NPB), N,N'-bis(naphthalen-2-yl)-N,N'-bis(phenyl)-benzidine (β-NPB), N,N'-bis(naphthalen-1-yl)-N,N'-bis(phenyl)-2,2'-dimethylbenzidine (α-NPD), di-[4,-(N,N-ditolyl-amino)-phenyl]cyclohexane (TAPC), N,N,N',N'-tetra-naphthalen-2-yl-benzidine (β-TNB) and N4,N4,N4',N4'-tetra(biphenyl-4-yl)biphenyl-4,4'-diamine (TPD15), poly(9,9-dioctylfluorene-co-bis-N,N'-(4-butylphenyl)-bis-N,N'-phenyl-1,4-phenylenediamine) (PFB), poly(9,9'-dioctylfluorene-co-N-(4-butylphenyl)diphenylamine) (TFB), poly(9,9'-dioctylfluorene-co-bis-N,N'-(4-butylphenyl)-bis-N,N'-phenylbenzidine) (BFB), poly(9,9-dioctylfluorene-co-bis-N,N'-(4-methoxyphenyl)-bis-N,N'-phenyl-1,4-phenylenediamine) (PFMO), etc., but the present invention is not limited thereto.

The aforementioned hole transport layer may have a thickness of 5 nm to 100 nm, for example, a thickness of 10 nm to 60 nm. When the thickness of the aforementioned hole transport layer satisfies this thickness range as described above, excellent hole transport characteristics may be obtained without any increase in drive voltage. However, the aforementioned hole transport layer may be omitted in this case.

Also, when it is assumed that the aforementioned hole transport layer is formed, the aforementioned hole transport layer may have a work function of Z eV. In this case, the aforementioned Z value may be a real number ranging from 5.2 to 5.6, but the present invention is not limited thereto.

A work function value ($Y_1$) of the first surface 32a of the surface buffer layer 32 of the aforementioned exciton buffer layer 30 may be in a range of 4.6 to 5.2, for example, in a range of 4.7 to 4.9. Also, a work function value ($Y_2$) of the second surface 32b of the surface buffer layer 32 of the aforementioned exciton buffer layer 30 may be less than or equal to the work function of the fluorine-based material included in the aforementioned surface buffer layer 32. For example, the aforementioned work function value ($Y_2$) may be in a range of 5.0 to 6.5, for example, in a range of 5.3 to 6.2, but the present invention is not limited thereto.

Figure 2:
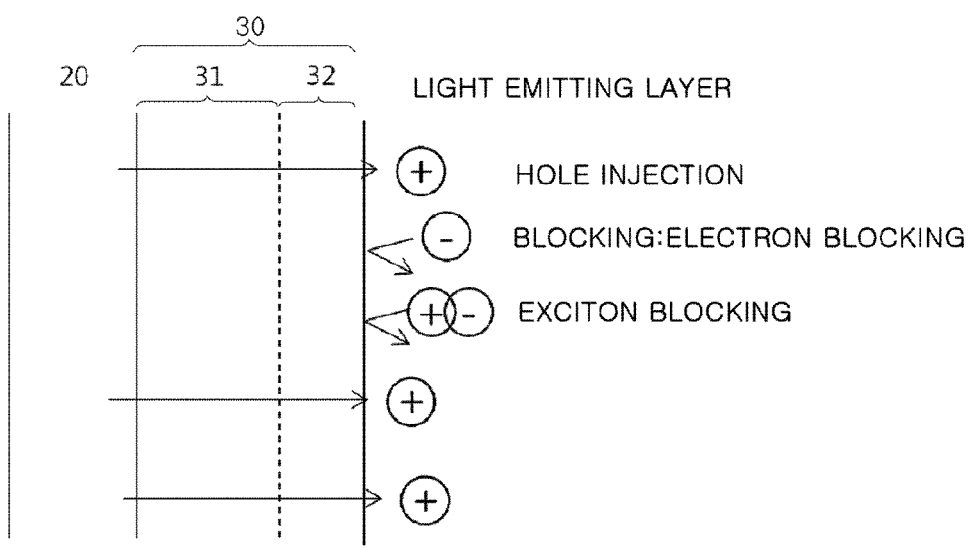
FIG. 2 is a schematic diagram showing an effect of an exciton buffer layer 30 according to one exemplary embodiment of the present invention.

FIG. 2 is a schematic diagram showing an effect of the exciton buffer layer 30 according to one exemplary embodiment of the present invention.

Referring to FIG. 2, it can be seen that the exciton buffer layer 30 according to one exemplary embodiment of the present invention may serve to improve hole injection efficiency, block electrons and inhibit the quenching of excitons.

Figure 1C:
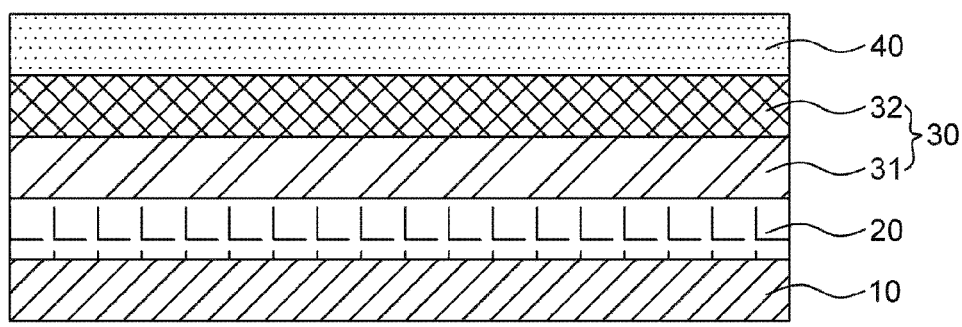
Figure 1D:
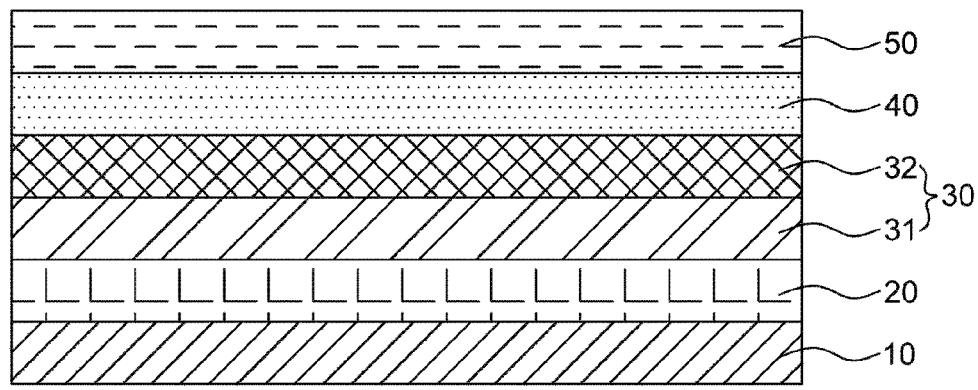

Referring to FIG. 1C, a light emitting layer 40 including the organic-inorganic-hybrid perovskite light-emitter is formed on the aforementioned exciton buffer layer 30.

Figure 3:
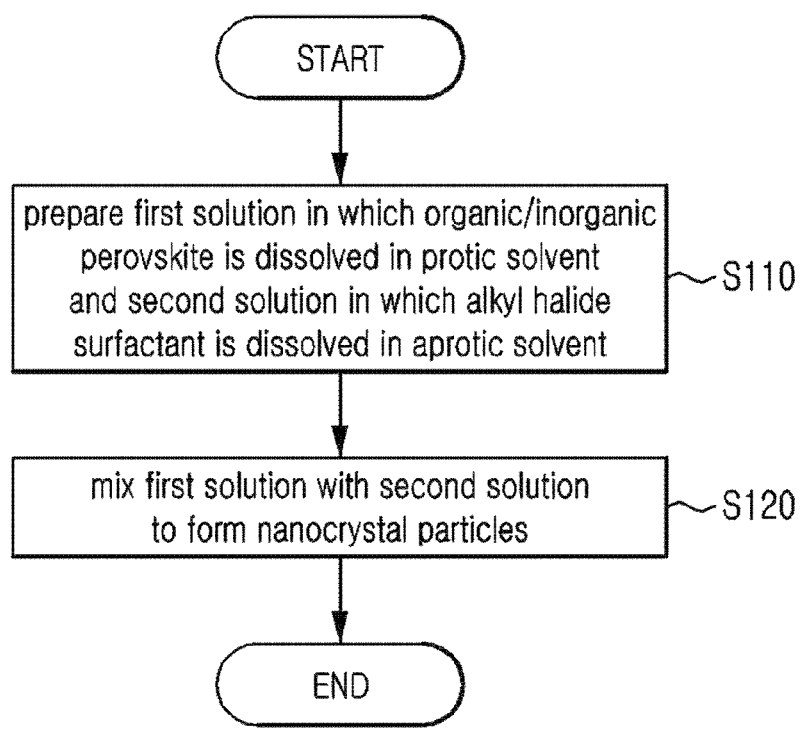
FIG. 3 is a flowchart illustrating a method for manufacturing an organic-inorganic-hybrid perovskite nanoparticle light-emitter according to one exemplary embodiment of the present invention.

FIG. 3 is a flowchart illustrating a method for manufacturing an organic-inorganic-hybrid perovskite light-emitter according to one exemplary embodiment of the present invention.

Referring to FIG. 3, the method for manufacturing an organic-inorganic-hybrid perovskite nanoparticle light-emitter may include preparing a first solution in which an organic-inorganic-hybrid perovskite is dissolved in a protic solvent and a second solution in which an alkyl halide surfactant is dissolved in an aprotic solvent (S100), and mixing the first solution with the second solution to form nanoparticles (S200).

That is, the organic-inorganic-hybrid perovskite nanoparticle light-emitter according to the present invention may be manufactured through an inverse nano-emulsion method.

Hereinafter, the manufacturing method will be described in further detail.

First, a first solution in which an organic-inorganic-hybrid perovskite is dissolved in a protic solvent and a second solution in which an alkyl halide surfactant is dissolved in an aprotic solvent are prepared (S100).

In this case, the protic solvent may include dimethyl formamide, gamma (γ)-butyrolactone, N-methylpyrrolidone, or dimethyl sulfoxide, but the present invention is not limited thereto.

In this case, the organic-inorganic-hybrid perovskite may also be a material having a 2D crystalline structure. For example, such an organic-inorganic-hybrid perovskite may have a structure of $ABX_3$, $A_2BX_4$, $ABX_4$ or $A_{n-1}B_nX_{3n+1}$ (where n is an integer ranging from 2 to 6).

In this case, A is an organic ammonium material, B is a metal material, and X is a halogen element.

For example, A may be $(CH_3NH_3)_n$, $((C_xH_{2x+1})_nNH_3)_2(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$, or $(C_nF_{2n+1}NH_3)_2$ (where n is an integer greater than or equal to 1, and x is an integer greater than or equal to 1). Also, B may be a divalent transition metal, a rare earth metal, an alkaline earth metal, Pb, Sn, Ge, Ga, In, Al, Sb, Bi, Po, or a combination thereof. In this case, the rare earth metal may be a divalent rare earth metal. For example, the rare earth metal may be Ge, Sn, Pb, Eu, or Yb. In addition, the alkaline earth metal may, for example, be Ca or Sr. Further, X may be Cl, Br, I, or a combination thereof.

Meanwhile, such perovskite may be manufactured by combining AX and $BX_2$ at a constant ratio. That is, the first solution may be formed by dissolving AX and $BX_2$ in a protic solvent at a constant ratio. For example, the first solution in which organic-inorganic-hybrid perovskite $(A_2BX_3)$ is dissolved may be prepared by dissolving AX and $BX_2$ in a protic solvent at a ratio of 2:1.

In this case, the alkyl structure may also include an acyclic alkyl having a structure of $C_nH_{2n+1}$ (where n is an integer ranging from 1 to 50), primary, secondary and tertiary alcohols having a structure of $C_nH_{2m+1}OH$, etc., an alkylamine having a structure of alkyl-N (e. g., hexadecyl amine, 9-octadecenylamine 1-amino-9-octadecene $(C_{19}H_{37}N)$), p-substituted aniline, and phenyl ammonium and fluorine ammonium, but the present invention is not limited thereto.

Also, the alkyl halide surfactant may have an alkyl-X structure. In this case, a halogen element corresponding to X may include Cl, Br, I, etc. In this case, the alkyl structure may also include an acyclic alkyl having a structure of $C_nH_{2n+1}$, primary, secondary and tertiary alcohols having a structure of $C_nH_{2n+1}OH$, etc., an alkylamine having a structure of alkyl-N (e.g., hexadecyl amine, 9-octadecenylamine 1-amino-9-octadecene $(C_{19}H_{37}N)$), p-substituted aniline, and phenyl ammonium and fluorine ammonium, but the present invention is not limited thereto.

Next, the first solution is mixed with the second solution to form nanoparticles (S200).

A process of mixing the first solution with the second solution to form the nanoparticles preferably includes adding the first solution to the second solution dropwise. In this case, the second solution may also be stirred. For example, the second solution in which an organic/inorganic perovskite (OIP) is dissolved is added dropwise to the second solution in which the alkyl halide surfactant is dissolved while strongly stirring to synthesize nanoparticles.

In this case, when the first solution is added dropwise to the second solution, the organic/inorganic perovskite (OIP) is precipitated from the second solution due to a difference in solubility. Also, a surface of the organic/inorganic perovskite (OIP) precipitated from the second solution is stabilized by the alkyl halide surfactant to generate well-dispersed organic/inorganic perovskite nanocrystals (OIP-NCs). Therefore, an organic-inorganic-hybrid perovskite nanoparticle light-emitter including organic/inorganic perovskite nanocrystals and a plurality of alkyl halide organic ligands surrounding the organic/inorganic perovskite nanocrystals may be manufactured.

In this case, the aforementioned organic-inorganic-hybrid perovskite colloidal nanoparticles may have a band gap energy of 1 eV to 5 eV.

Also, the aforementioned organic-inorganic-hybrid perovskite nanoparticles may have a light emission wavelength of 200 nm to 1,300 nm.

Meanwhile, the size of such organic/inorganic perovskite nanocrystals may be controlled by adjusting a length or shape factor of the alkyl halide surfactant. For example, the adjustment of the shape factor may be achieved by controlling the size using a linear, tapered or inverse triangular surfactant.

Meanwhile, the size of the organic/inorganic perovskite nanocrystals thus generated may be in a range of 1 to 900 nm. When the organic/inorganic perovskite nanocrystals are formed so that the size of the organic/inorganic perovskite nanocrystals is greater than 900 nm, the organic/inorganic perovskite nanocrystals may have a fundamental problem in that excitons are dissociated into free charges and quenched in the large nanocrystals without leading to light emission due to thermal ionization and delocalization of charge carriers.

Figure 4:
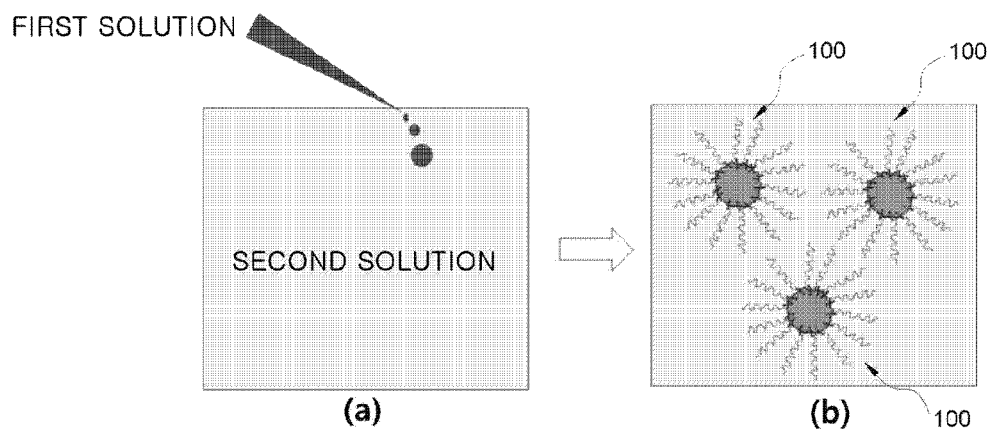
FIG. 4 is a schematic diagram showing the method for manufacturing an organic-inorganic-hybrid perovskite nanoparticle light-emitter according to one exemplary embodiment of the present invention.

FIG. 4 is a schematic diagram showing a method for manufacturing an organic-inorganic-hybrid perovskite nanoparticle light-emitter according to one exemplary embodiment of the present invention using an inverse nano-emulsion method.

Referring to FIG. 4(a), a first solution in which an organic-inorganic-hybrid perovskite is dissolved in a protic solvent is added dropwise to a second solution in which an alkyl halide surfactant is dissolved in an aprotic solvent.

In this case, the protic solvent may include dimethyl formamide, γ-butyrolactone, N-methylpyrrolidone, or dimethyl sulfoxide, but the present invention is not limited thereto.

In this case, the organic-inorganic-hybrid perovskite may have a structure of $ABX_3$, $A_2BX_4$, $ABX_4$ or $A_{n-1}B_nX_{3n+1}$ (where n is an integer ranging from 2 to 6).

In this case, A is an organic ammonium material, B is a metal material, and X is a halogen element.

For example, A may be $(CH_3NH_3)_n$, $((C_xH_{2x+1})_nNH_3)_2(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$, or $(C_nF_{2n+1}NH_3)_2$ (where n is an integer greater than or equal to 1, and x is an integer greater than or equal to 1). Also, B may be a divalent transition metal, a rare earth metal, an alkaline earth metal, Pb, Sn, Ge, Ga, In, Al, Sb, Bi, Po, or a combination thereof. In this case, the rare earth metal may be a divalent rare earth metal. For example, the rare earth metal may be Ge, Sn, Pb, Eu, or Yb. Also, the alkaline earth metal may, for example, be Ca or Sr. Further, X may be Cl, Br, I, or a combination thereof.

Meanwhile, in this case, the structures of perovskite may be formed by combining AX and $BX_2$ at different ratios. For example, the first solution in which organic-inorganic-hybrid perovskite $(A_2BX_3)$ is dissolved may be prepared by dissolving AX and $BX_2$ in a protic solvent at a ratio of 2:1.

Meanwhile, as a synthesis example of AX in this case, when A is $CH_3NH_3$ and X is Br, $CH_3NH_3Br$ may be obtained by dissolving methylamine ($CH_3NH_2$) and hydrobromic acid (HBr) under a nitrogen atmosphere and evaporating the solvent.

Referring to FIG. 4(b), when the first solution is added to the second solution, the organic-inorganic-hybrid perovskite is precipitated from the second solution due to a difference in solubility, and a surface of such precipitated organic-inorganic-hybrid perovskite is stabilized as the alkyl halide surfactant surrounds the organic-inorganic-hybrid perovskite. At the same time, an organic-inorganic-hybrid perovskite nanoparticle light-emitter 100 including the well-dispersed organic-inorganic-hybrid perovskite nanocrystals is generated. In this case, the surfaces of the organic-inorganic-hybrid perovskite nanocrystals are surrounded by organic ligands that are alkyl halides.

Next, the organic-inorganic-hybrid perovskite nanoparticle light-emitter may be obtained by applying heat to the protic solvent including the organic-inorganic-hybrid perovskite nanoparticle light-emitter 100 dispersed in the aprotic solvent in which the alkyl halide surfactant is dissolved in order to selectively evaporate the protic solvent or by adding to a co-solvent capable of dissolving both of the protic solvent and the aprotic solvent to selectively extract the protic solvent including the nanoparticles from the aprotic solvent.

The organic-inorganic-hybrid perovskite nanoparticle light-emitter according to one exemplary embodiment of the present invention will be described.

Figure 5:
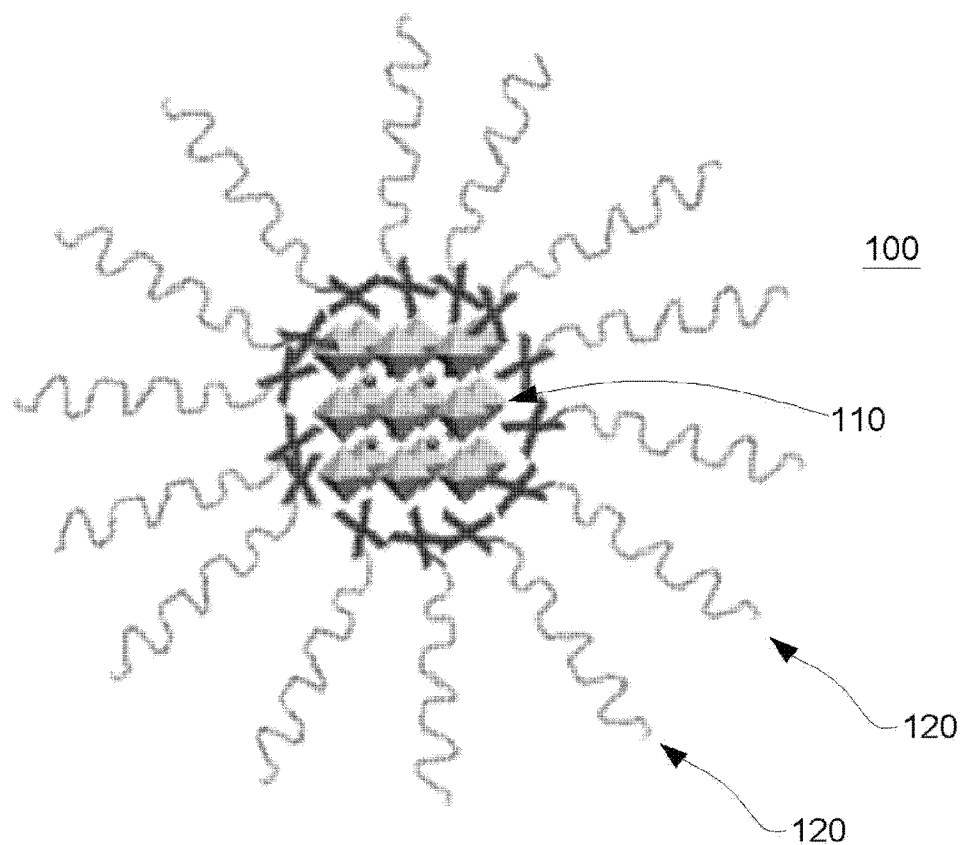
FIG. 5 is a schematic diagram showing an organic-inorganic-hybrid perovskite colloidal nanoparticle and an inorganic metal halide perovskite colloidal nanoparticle according to one exemplary embodiment of the present invention.

FIG. 5 is a schematic diagram showing an organic-inorganic-hybrid perovskite colloidal nanoparticle light-emitter and an inorganic metal halide perovskite colloidal nanoparticle light-emitter according to one exemplary embodiment of the present invention.

In this case, FIG. 5 shows organic-inorganic-hybrid perovskite colloidal nanoparticles. Here, when the organic-inorganic-hybrid perovskite of FIG. 5 is exchanged with an inorganic metal halide perovskite, inorganic metal halide colloidal nanoparticles are formed, and thus a description thereof is the same as described above.

Referring to FIG. 5, the light-emitter according to one exemplary embodiment of the present invention includes, as the organic-inorganic-hybrid perovskite nanoparticles (or inorganic metal halide perovskite), 2D organic-inorganic-hybrid perovskite nanocrystals 110 having a lamellar structure in which organic substance planes (or alkali metal planes) and inorganic substance planes are alternately stacked.

Such a 2D organic-inorganic-hybrid perovskite may have a structure of $ABX_3$, $A_2BX_4$, $ABX_4$ or $A_{n-1}B_nX_{3n+1}$ (where n is an integer ranging from 2 to 6).

In this case, A is an organic ammonium material, B is a metal material, and X is a halogen element.

For example, A may be $(CH_3NH_3)_n$, $((C_xH_{2x+1})_nNH_3)_2(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$, or $(C_nF_{2n+1}NH_3)_2$ (where n is an integer greater than or equal to 1, and x is an integer greater than or equal to 1)). Also, B may be a divalent transition metal, a rare earth metal, an alkaline earth metal, Pb, Sn, Ge, Ga, In, Al, Sb, Bi, Po, or a combination thereof. In this case, the rare earth metal may be a divalent rare earth metal. For example, the rare earth metal may be Ge, Sn, Pb, Eu, or Yb. Also, the alkaline earth metal may, for example, be Ca or Sr. Further, X may be Cl, Br, I, or a combination thereof.

Meanwhile, the organic-inorganic-hybrid perovskite nanoparticle light-emitter 100 according to the present invention may further include a plurality of organic ligands 120 surrounding the aforementioned organic-inorganic-hybrid perovskite nanocrystals 110. In this case, the organic ligands 120 may include an alkyl halide as a material used as a surfactant. Therefore, the alkyl halide used as the surfactant becomes an organic ligand surrounding surfaces of the organic-inorganic-hybrid perovskite nanocrystals in order to stabilize a surface of the precipitated organic-inorganic-hybrid perovskite, as described above.

Meanwhile, when the length of such an alkyl halide surfactant is short, an increase in size of nanocrystals to be formed may be caused, thereby forming the nanocrystals having a size of more than 900 nm. In this case, the nanocrystals may have a fundamental problem in that excitons are dissociated into free charges and quenched in the large nanocrystals without leading to light emission due to thermal ionization and delocalization of charge carriers.

That is, the size of the organic-inorganic-hybrid perovskite nanocrystals to be formed is inversely proportional to the length of the alkyl halide surfactant used to form such nanocrystals.

Therefore, the size of the organic-inorganic-hybrid perovskite nanocrystals to be formed using an alkyl halide having a length greater than or equal to a predetermined length as the surfactant may be controlled to a size less than or equal to a predetermined size. For example, organic-inorganic-hybrid perovskite nanocrystals having a size of 900 nm or less may be formed using octadecyl-ammonium bromide as the alkyl halide surfactant.

Also, the inorganic metal halide perovskite may have a structure of $ABX_3$, $A_2BX_4$, $ABX_4$ or $A_{n-1}Pb_nI_{3n+1}$ (where n is an integer ranging from 2 to 6).

In this case, A may be an alkali metal, B may be a divalent transition metal, a rare earth metal, an alkaline earth metal, Pb, Sn, Ge, Ga, In, Al, Sb, Bi, Po, or a combination thereof, and X may be Cl, Br, I or a combination thereof. In this case, the rare earth metal may, for example, be Ge, Sn, Pb, Eu, or Yb. Also, the alkaline earth metal may, for example, be Ca or Sr.

Also, the inorganic metal halide perovskite colloidal nanoparticles according to the present invention may further include a plurality of organic ligands surrounding the aforementioned inorganic metal halide perovskite nanocrystalline structure. Such organic ligands may include an alkyl halide.

Figure 6:
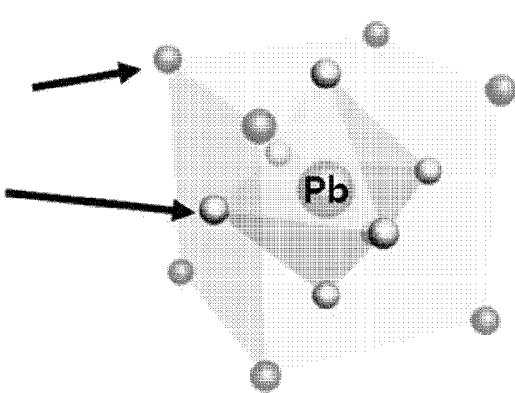
FIG. 6 is a schematic diagram of a perovskite nanocrystalline structure according to one exemplary embodiment of the present invention.

FIG. 6 is a schematic diagram of a perovskite nanocrystalline structure according to one exemplary embodiment of the present invention.

The structures of the organic-inorganic-hybrid perovskite nanocrystal and inorganic metal halide perovskite nanocrystal are shown together in FIG. 6.

Referring to FIG. 6, it can be seen that the organic-inorganic-hybrid perovskite (or inorganic metal halide perovskite) nanocrystalline structure according to one exemplary embodiment of the present invention includes an organic ammonium (or an alkali metal) and halides.

Referring again to FIG. 1D, a second electrode 50 is formed on the aforementioned light emitting layer 40.

The aforementioned second electrode 50 is an electrode in which electrons are injected, and is composed of a material having a conductive property. The aforementioned second electrode 50 is preferably a metal, and may be particularly Al, Au, Ag, Cu, Pt, W, Ni, Zn, Ti, Zr, Hf, Cd, Pd, etc.

As a deposition process for forming the aforementioned second electrode 50, physical vapor deposition (PVD), chemical vapor deposition (CVD), sputtering, pulsed laser deposition (PLD), thermal evaporation, electron beam evaporation, atomic layer deposition (ALD), molecular beam epitaxy (MBE), and the like may be used.

The light emitting device thus formed includes a first electrode 20, an exciton buffer layer 30 disposed on the aforementioned first electrode 20 and including a conductive material and a fluorine-based material, a light emitting layer 40 disposed on the aforementioned exciton buffer layer 30 and including an organic-inorganic-hybrid perovskite nanoparticle light-emitter with which an organic ligand is substituted, and a second electrode 50 disposed on the aforementioned light emitting layer 40.

In this case, a light emitting device having a low work function and high conductivity as well may be manufactured as the aforementioned exciton buffer layer 30 is formed. In the nanoparticle light-emitter including the organic-inorganic-hybrid perovskite nanocrystals, an organic-inorganic-hybrid perovskite having a combined FCC and BCC crystalline structure in the nanoparticle light-emitter may be formed, a lamellar structure in which an organic plane and an inorganic plane are alternatively deposited may be formed, and excitons can be confined to the inorganic plane, thereby expressing high color purity.

The inorganic metal halide perovskite light emitting device according to one exemplary embodiment of the present invention will be described.

The light emitting device may include a first electrode, an exciton buffer layer disposed on the first electrode and including a conductive material and a fluorine-based material having lower surface energy than the conductive material, a light emitting layer disposed on the exciton buffer layer and including an inorganic metal halide perovskite material, and a second electrode disposed on the light emitting layer.

The exciton buffer layer is characterized by being configured so that a conductive layer including the conductive material and a surface buffer layer including the fluorine-based material having lower surface energy than the conductive material are sequentially deposited. The surface buffer layer is characterized by having a thickness of 3 nm or more. The exciton buffer layer is characterized by having a conductivity of $10^{-7}$ S/cm to 1,000 S/cm. The fluorine-based material is characterized by having a surface energy of 30 mN/m or less.

A specific description of the inorganic metal halide perovskite light emitting device is the same as in the organic-inorganic-hybrid perovskite light emitting device, and thus a repeated description thereof is omitted.

By way of another example, a photoactive layer including the aforementioned organic/inorganic perovskite nanocrystals or inorganic metal halide perovskite nanocrystals may also be applied to a solar cell. Such a solar cell may include a first electrode, a second electrode, a photoactive layer interposed between the first electrode and the second electrode and including the aforementioned perovskite colloidal nanoparticles, and an exciton buffer layer.

Hereinafter, preferred embodiments of the present invention will be presented to aid in understanding the present invention. However, it should be understood that the following examples are merely provided to aid in understanding the present invention, but not intended to limit the scope of the present invention.

MODE FOR INVENTION

Preparative Example 1

A light emitting device according to one exemplary embodiment of the present invention was manufactured.

First, an ITO substrate (a glass substrate coated with an ITO positive electrode) was prepared, and a solution obtained by mixing PEDOT:PSS (CLEVIOS PH commercially available from Heraeus) as a conductive material and a material of the following Polymer 1 as a fluorine-based material was then spin-coated onto the ITO positive electrode. Thereafter, the solution was thermally treated at 150° C. for 30 minutes to form an exciton buffer layer having a thickness of 40 nm.

After the thermal treatment, a multilayer exciton buffer layer in which a conductive layer containing more than 50% of the conductive polymer and a surface buffer layer containing more than 50% of the aforementioned material of Polymer 1 were sequentially deposited was formed on the aforementioned ITO positive electrode. That is, the conductive layer and the surface buffer layer were formed through self-assembly.

The exciton buffer layer including the aforementioned conductive layer and the surface buffer layer included PEDOT, PSS and Polymer 1 at a weight ratio of 1:6:25.4 and had a work function of 5.95 eV.

A solution (40% by weight) including $CH_3NH_3PbBr_3$ and dimethyl formamide was spin-coated onto the aforementioned exciton buffer layer, and thermally treated at 90° C. for 10 minutes to form a $CH_3NH_3PbBr_3$ perovskite light emitting layer having a thickness of 150 nm. Such a $CH_3NH_3PbBr_3$ perovskite light emitting layer had a HOMO energy level of −5.9 eV, and a surface of a second layer in the aforementioned buffer layer had a work function of −5.95 eV.

Next, 1,3,5-tris(1-phenyl-1H-benzimidazol-2-yl)benzene (TPBI) having a thickness of 50 nm was deposited on the light emitting layer under a high vacuum of $1\times10^{-7}$ Torr or less to form an electron transport layer, LiF having a thickness of 1 nm was deposited on the electron transport layer to form an electron injection layer, and aluminum having a thickness of 100 nm was deposited on the electron injection layer to form a negative electrode, thereby manufacturing an organic-inorganic-hybrid perovskite light emitting device.

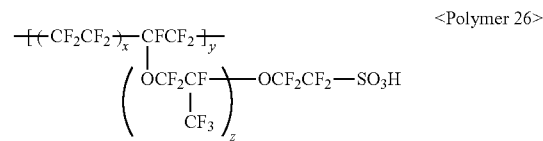

<Polymer 26>

(In the aforementioned Polymer 26, x=1300, y=200, and z=1)

Preparative Example 2

An organic-inorganic-hybrid perovskite light emitting device was manufactured in the same manner as in Preparative Example 1, except that the formed exciton buffer layer included PEDOT, PSS and Polymer 1 at a weight ratio of 1:6:12.7 and had a work function of 5.79 eV.

Preparative Example 3

An organic-inorganic-hybrid perovskite light emitting device was manufactured in the same manner as in Preparative Example 1, except that the formed exciton buffer layer included PEDOT, PSS and Polymer 1 at a weight ratio of 1:6:6.3 and had a work function of 5.72 eV.

Preparative Example 4

An organic-inorganic-hybrid perovskite light emitting device was manufactured in the same manner as in Preparative Example 1, except that the formed exciton buffer layer included PEDOT, PSS and Polymer 1 at a weight ratio of 11:6:3.2 and had a work function of 5.63 eV.

Preparative Example 5

An organic-inorganic-hybrid perovskite light emitting device was manufactured in the same manner as in Preparative Example 1, except that the formed exciton buffer layer included PEDOT, PSS and Polymer 1 at a weight ratio of 1:6:1.6 and had a work function of 5.55 eV.

Comparative Example 1

An organic-inorganic-hybrid perovskite light emitting device was manufactured in the same manner as in Preparative Example 1, except that a single-layer buffer layer (having a work function of 5.20 eV) having a thickness of 40 nm was formed by spin-coating the aforementioned PEDOT:PSS (CLEVIOS PH commercially available from Heraeus) solution of Preparative Example 1 onto an ITO positive electrode and thermally treating the PEDOT:PSS solution at 150° C. for 30 minutes in order to form an exciton buffer layer. That is, in this case, the buffer layer was a PEDOT:PSS layer.

Figure 7:
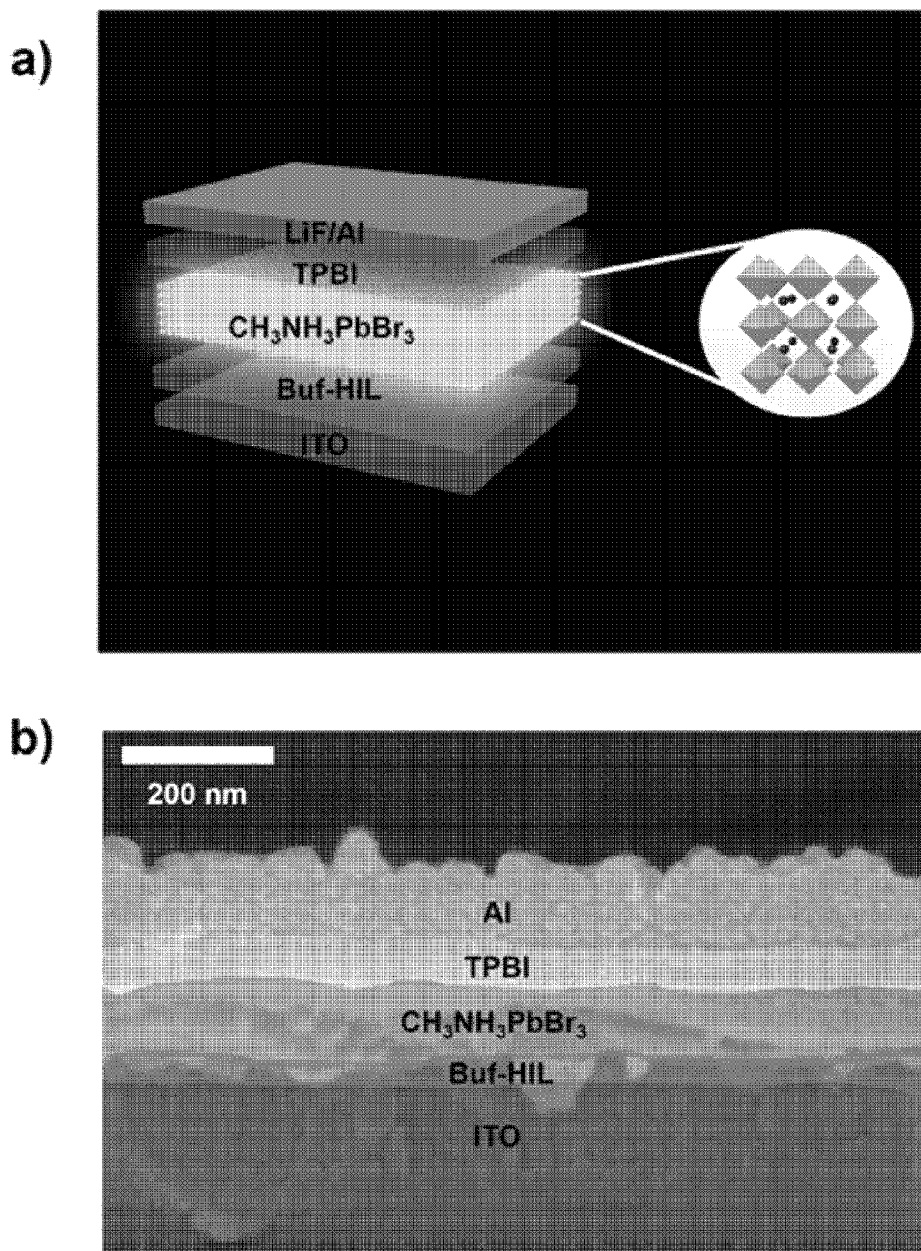
FIG. 7 is a schematic diagram (a) and an SEM image (b) of a light emitting device manufactured in Preparative Example 1 of the present invention.
Figure 8A:
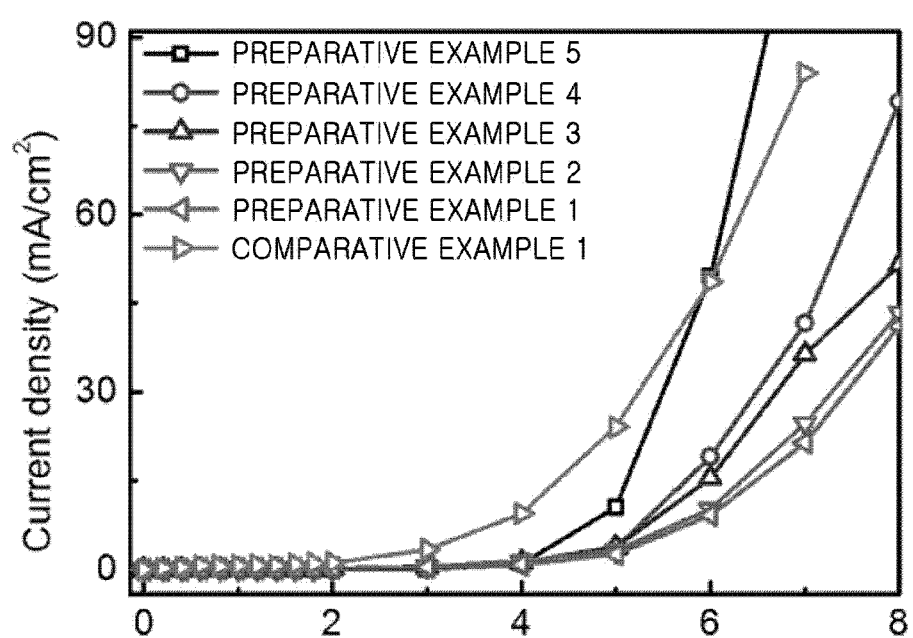
FIGS. 8A to 8D are graphs illustrating current-voltage characteristics (a), brightness-voltage characteristics (b), current efficiency-voltage characteristics (c), and external quantum efficiency-voltage characteristics (d) of each of light emitting devices of Preparative Examples 1 to 5 and Comparative Example 1.
Figure 8B:
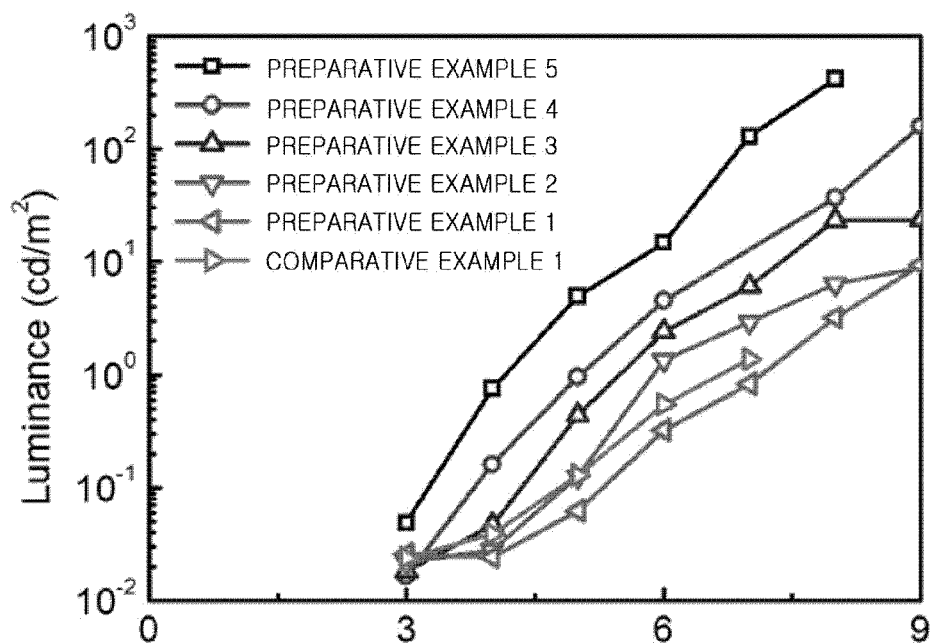
Figure 8C:
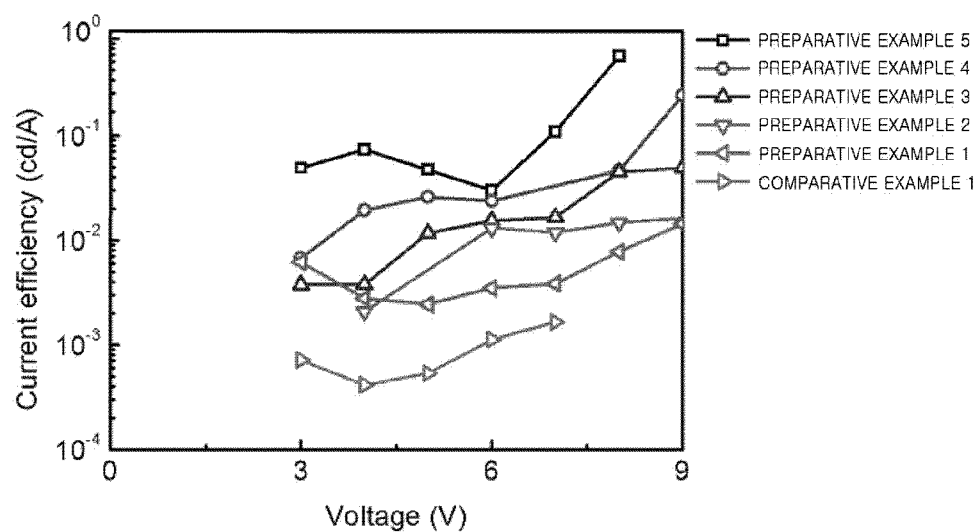
Figure 8D:
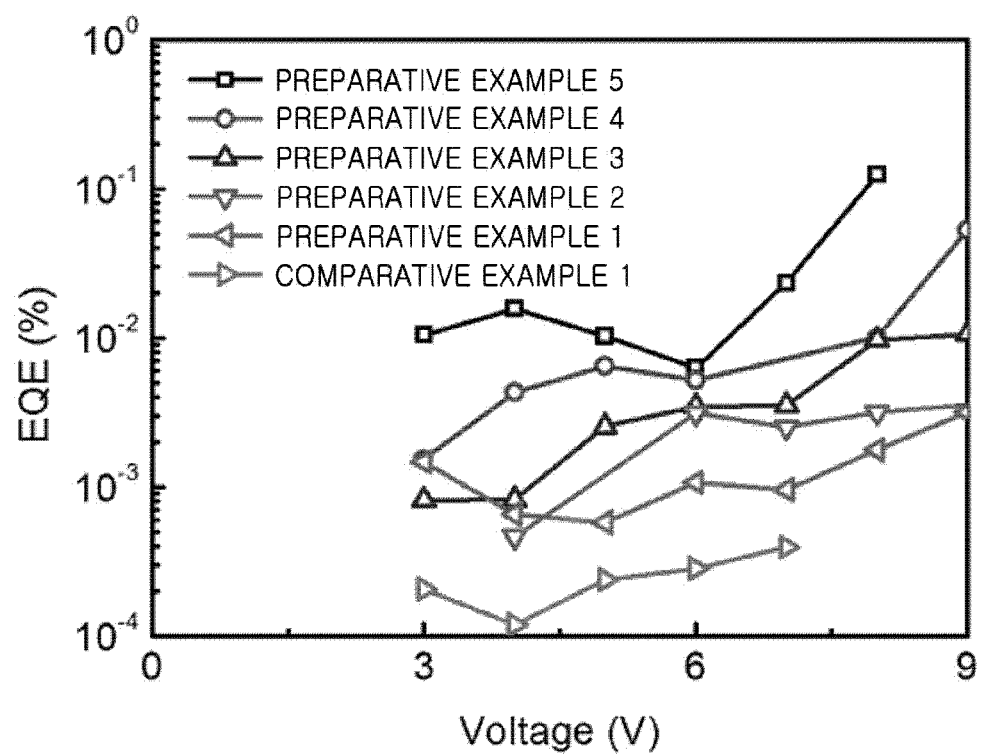

FIG. 7 is a schematic diagram (a) and an SEM image (b) of the light emitting device manufactured in Preparative Example 1 of the present invention.

Referring to FIG. 7, it can be seen that the light emitting device according to one exemplary embodiment of the present invention included the first electrode, the exciton buffer layer, the light emitting layer including the organic-inorganic-hybrid perovskite, and the second electrode, which were uniformly formed in this order.

FIGS. 8A to 8D are graphs illustrating current-voltage characteristics (a), brightness-voltage characteristics (b), current efficiency-voltage characteristics (c), and external quantum efficiency-voltage characteristics (d) of each of the light emitting devices of Preparative Examples 1 to 5 and Comparative Example 1.

Referring to FIGS. 8A to 8D, it can be seen that the brightness, current efficiency and external quantum efficiency of the light emitting device were enhanced as the PFI (a fluorine-based material of Polymer 1) was included in the exciton buffer layer and a weight ratio of the aforementioned PFI increased.

Preparative Example 6

First, a glass substrate was prepared, and a solution obtained by mixing PEDOT:PSS (CLEVIOS PH commercially available from Heraeus) as the conductive material and the aforementioned material of Polymer 1 as the fluorine-based material was then spin-coated onto the glass substrate, and thermally treated at 150° C. for 30 minutes to form an exciton buffer layer having a thickness of 40 nm.

After the thermal treatment, a multilayer exciton buffer layer in which a conductive layer containing more than 50% of the conductive polymer and a surface buffer layer containing more than 50% of the aforementioned material of Polymer 1 were sequentially deposited was formed on the aforementioned glass substrate. That is, the conductive layer and the surface buffer layer were formed through self-assembly.

The exciton buffer layer including the aforementioned conductive layer and the surface buffer layer included PEDOT, PSS and Polymer 1 at a weight ratio of 1:6:25.4 and had a work function of 5.95 eV.

A solution (0.6% by weight) including $CH_3NH_3PbBr_3$ and dimethyl formamide was spin-coated onto the aforementioned exciton buffer layer, and thermally treated at 90° C. for 10 minutes to form a $CH_3NH_3PbBr_3$ perovskite light emitting layer having a thickness of 10 nm.

Such a $CH_3NH_3PbBr_3$ perovskite light emitting layer had a HOMO energy level of −5.9 eV, and a surface of a second layer in the aforementioned buffer layer had a work function of −5.95 eV. Because a thin film sample having the light emitting layer rather than the light emitting device exposed at a top portion thereof was required to check the lifetime characteristics of the light emitting layer, a deposition process was not carried out.

Preparative Example 7

An organic-inorganic-hybrid perovskite thin film sample was formed in the same manner as in Preparative Example 6, except that the formed exciton buffer layer included PEDOT, PSS and Polymer 1 at a weight ratio of 1:6:12.7 and had a work function of 5.79 eV.

Preparative Example 8

An organic-inorganic-hybrid perovskite thin film sample was formed in the same manner as in Preparative Example 6, except that the formed exciton buffer layer included PEDOT, PSS and Polymer 1 at a weight ratio of 1:6:6.3 and had a work function of 5.72 eV.

Preparative Example 9

An organic-inorganic-hybrid perovskite thin film sample was formed in the same manner as in Preparative Example 6, except that the formed exciton buffer layer included PEDOT, PSS and Polymer 1 at a weight ratio of 1:6:1.6 and had a work function of 5.55 eV.

Comparative Example 2

An organic-inorganic-hybrid perovskite thin film sample was manufactured in the same manner as in Preparative Example 6, except that a single-layer buffer layer (having a work function of 5.20 eV) having a thickness of 40 nm was formed by spin-coating the aforementioned PEDOT:PSS (CLEVIOS PH commercially available from Heraeus) solution of Preparative Example 6 onto an ITO positive electrode and thermally treating the PEDOT:PSS solution at 150° C. for 30 minutes in order to form an exciton buffer layer. That is, in this case, the buffer layer was a PEDOT:PSS layer.

Preparative Example 10: Preparation of Inorganic Metal Halide Perovskite Colloidal Nanoparticles Inorganic metal halide perovskite colloidal nanoparticles according to one exemplary embodiment of the present invention were formed. Here, the inorganic metal halide perovskite colloidal nanoparticles were formed using an inverse nano-emulsion method.

Specifically, cesium carbonate ($Cs_2CO_3$) and oleic acid were added to octadecene (ODE) serving as an aprotic solvent, and reacted at a high temperature to prepare a third solution. $PbBr_2$, oleic acid and oleylamine were added to an aprotic solvent, and reacted at a high temperature (120° C.) for an hour to prepare a fourth solution.

Next, the third solution was added dropwise to the fourth solution while strongly stirring to form an inorganic metal halide perovskite ($CsPbBr_3$) colloidal nanoparticle light-emitter having a 3D structure.

Therefore, a solution including the inorganic metal halide perovskite nanoparticles was prepared.

Preparative Example 11

A light emitting device was manufactured in the same manner as in Preparative Example 1, except that a solution (40% by weight) including $CsPbBr_3$ prepared in Preparative Example 10 and dimethyl formamide was spin-coated onto an exciton buffer layer, and thermally treated at 90° C. for 10 minutes to form a $CsPbBr_3$ inorganic metal halide perovskite light emitting layer having a thickness of 150 nm.

Preparative Example 12

A solar cell according to one exemplary embodiment of the present invention was manufactured.

First, an ITO substrate (a glass substrate coated with an ITO positive electrode) was prepared, and a hole extraction layer was then formed on the ITO positive electrode using a method for manufacturing the aforementioned exciton buffer layer.

An organic-inorganic-hybrid perovskite thin film according to Preparative Example 1 was formed on the hole extraction layer, and then coated with phenyl-C61-butyric acid methyl ester (PCBM) to form a photoactive layer. Thereafter, aluminum (Al) having a thickness of 100 nm was directly deposited on the photoactive layer to prepare a perovskite solar cell using an exciton buffer layer.

Experimental Example: Analysis of Lifetime Characteristics and Photoluminescence Characteristics of Light Emitting Devices To analyze exciton lifetime characteristics and photoluminescence characteristics of the organic-inorganic-hybrid perovskite thin film samples manufactured in Preparative Examples 6 to 9 and Comparative Example 2, time-resolved photoluminescence (TR-PL) measurement was performed. Each of the samples was excited by a Ti:sapphire laser having a wavelength of 350 nm, a pulse duration of 150 fs, and a repetition rate of 80 MHz. The PL lifetime was measured at 530 nm and 300 K using a streak camera.

Figure 9A:
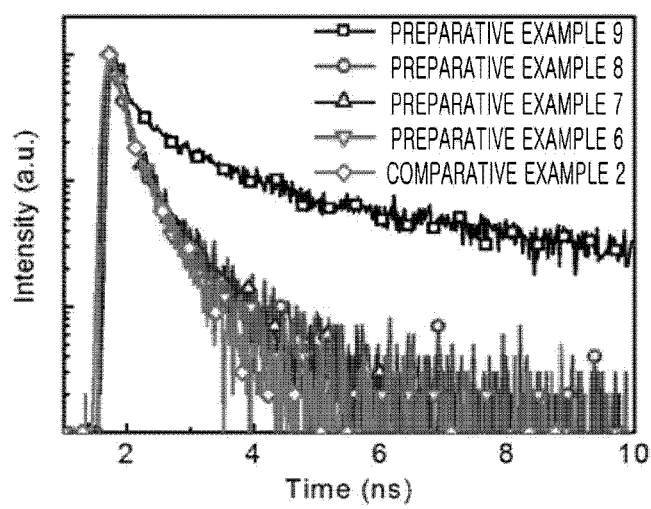
FIGS. 9A and 9B are graphs illustrating PL lifetime characteristics and strength characteristics of light emitting devices of Preparative Examples 6 to 9 of the present invention and Comparative Example 2.
Figure 9B:
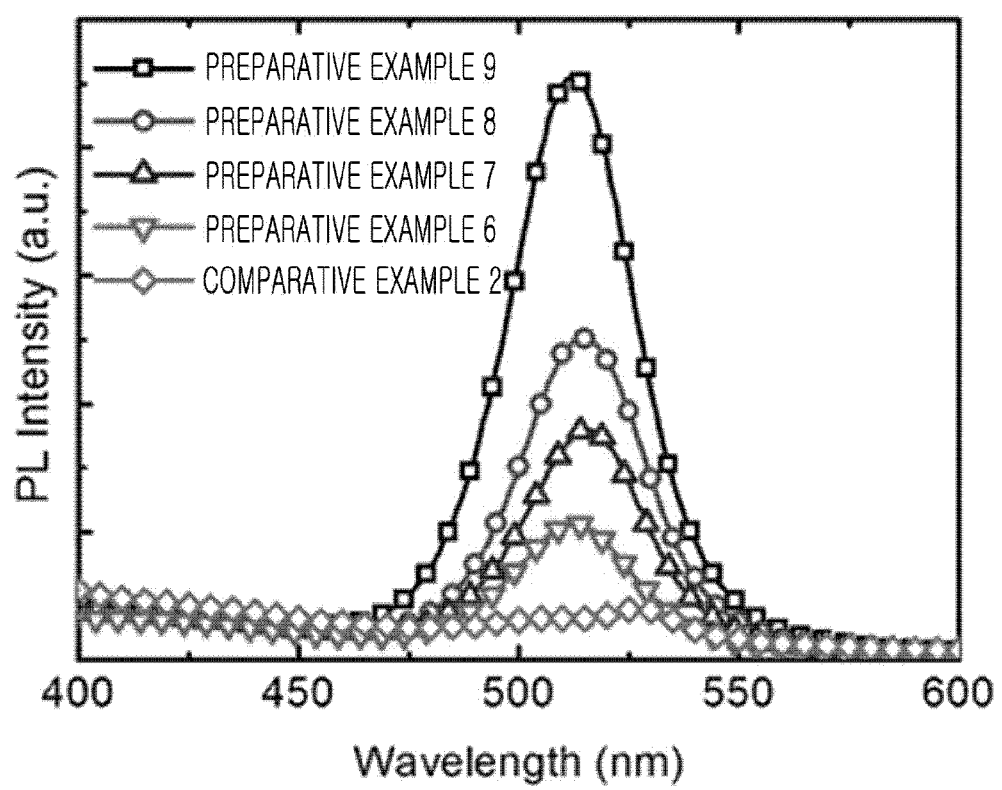

FIGS. 9A and 9B are graphs illustrating PL lifetime characteristics and strength characteristics of the light emitting devices of Preparative Examples 6 to 9 of the present invention and Comparative Example 2.

Referring to FIGS. 9A and 9B, the average PL lifetimes were measured to be 4.7 ns, 0.46 ns, 0.42 ns, 0.39 ns, and 0.34 ns in the case of Preparative Example 6, Preparative Example 7, Preparative Example 8, Preparative Example 9, and Comparative Example 2, respectively.

In conclusion, it was confirmed that the average PL lifetime increased with an increasing weight ratio of PFI. This was because PFI (Polymer 1) on a surface of the exciton buffer layer serves as a buffer for preventing the quenching of excitons. Also, in the case of the PFI-free PEDOT:PSS buffer layer (Comparative Example 2), the excitons in a perovskite layer were able to be quenched via non-radiative energy transfer generated due to a difference in energy level between two layers. In this case, the average PL lifetime of the excitons decreased.

Also, it can be seen that the intensity of PL was also able to increase with an increasing weight ratio of the aforementioned PFI.

Preparative Example 10

An organic-inorganic-hybrid perovskite light emitting device was manufactured in the same manner as in Example 1, except that the following Polymer 2 was used as the fluorine-based material to form the exciton buffer layer.

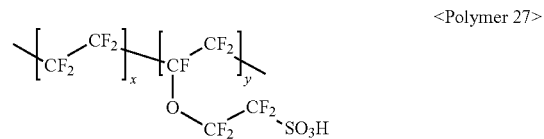

<Polymer 27>

(In the aforementioned Polymer 27, x=1,300, and y=200)

Although the present invention has been shown and described with reference to the preferred embodiments thereof, it would be appreciated by those skilled in the art that changes and modifications may be made in these embodiments without departing from the principles and spirit of the disclosure, the scope of which is defined in the claims and their equivalents.

| [Brief Description of Parts in Drawings] | |
|---|---|
| 10: substrate | 20: first electrode |
| 30: exciton buffer layer | 31: conductive layer |
| 32: surface buffer layer | 40: light emitting layer |
| 50: second electrode | |

The invention claimed is:

1. A solar cell comprising:
   a first electrode;
   a second electrode; and
   at least one photoactive layer comprising perovskite nanoparticles between the first electrode and the second electrode,
   wherein the perovskite nanoparticles include perovskite nanocrystals in a form of particle and a plurality of ligands or surfactants surrounding the perovskite nanocrystals.
   wherein the perovskite nanocrystals have a structure of $A_2BX_4$, $ABX_4$, $ABX_3$ or $A_{n-1}B_nX_{3n+1}$ (where n is an integer ranging from 2 to 6), and
   wherein A is at least one organic ammonium material or alkali metal, B is at least one metal material, and X is at least one halogen element.

2. The solar cell of claim 1,
   wherein the ligands or surfactants include an alkyl halide.

3. The solar cell of claim 2,
   wherein A is Cs:
   B is at least one selected from the group consisting of a divalent transition metal, a rare earth metal, an alkaline earth metal, Pb, Sn, Ge, Ga, In, Al, Sb, Bi, and Po; and
   X is at least one selected from the group consisting of Cl, Br, and I.

4. The solar cell of claim 2, wherein the alkyl halide is octadecyl ammonium bromide or alkyl-X (X is a Cl, Br, or I) where the alkyl is an acyclic alkyl, or a structure including alkylamine, p-substituted aniline, phenyl ammonium, or fluorine ammonium.

5. The solar cell of claim 1, further comprising at least one exciton buffer layer, the at least one exciton buffer layer comprising:
   at least one conductive material and at least one fluorine-based material having lower surface energy than the conductive material, and
   wherein the exciton buffer layer is positioned between the first electrode and the second electrode and can prevent quenching of excitons.

6. The solar cell of claim 5,
   wherein the at least one conductive material comprises at least one selected from the group consisting of a conductive polymer, a metallic carbon nanotube, graphene, a reduced graphene oxide, metal nanowires, semiconductor nanowires, carbon nanodots, metal nanodots, and a conductive oxide.

7. The solar cell of claim 6,
   wherein the conductive polymer comprises at least one selected from the group consisting of polythiophene, polyaniline, polypyrrole, polystyrene, sulfonated polystyrene, poly(3,4-ethylene dioxythiophene), a self-doped conductive polymer, and a derivative thereof.

8. A method for manufacturing perovskite nanoparticles, comprising:
   preparing a first solution in which a perovskite is dissolved in a protic solvent; and
   preparing a second solution in which plurality of surfactants or ligands are dissolved in an aprotic solvent; and
   mixing the first solution with the second solution to form nanoparticles due to a difference in solubility between the protic solvent and the aprotic solvent,
   wherein the surfaces of the nanoparticles are surrounded by the surfactants or ligands.

9. The method for manufacturing perovskite nanoparticles of claim 8,
   wherein, the protic solvent may include dimethyl formamide, gamma (γ)-butyrolactone, N-methylpyrrolidone, or dimethyl sulfoxide; and
   wherein the aprotic solvent may also include dichloroethylene, trichloroethylene, chloroform, chlorobenzene, dichlorobenzene, styrene, dimethyl formamide, dimethyl sulfoxide, xylene, toluene, cyclohexene, or isopropyl alcohol.

10. The method for manufacturing perovskite nanoparticles of claim 8,
    wherein the perovskite has a structure of $A_2BX_4$, $ABX_4$, $ABX_3$ or $A_{n-1}B_nX_{3n+1}$ (where n is an integer ranging from 2 to 6), and
    wherein A is at least one organic ammonium material or alkali metal, B is at least one metal material, and X is at least one halogen element.

11. The method for manufacturing perovskite nanoparticles of claim 8,
    wherein the ligands or surfactants include an alkyl halide.

12. The method for manufacturing perovskite nanoparticles of claim 10,
    wherein A is at least one selected from the group consisting of $(CH_3NH_3)_n$, $((C_xH_{2x+1})_nNH_3)_2(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$, alkali metal or $(C_nF_{2n+1}NH_3)_2$ (where n is an integer greater than or equal to 1, and x is an integer greater than or equal to 1, R is H or a C1-C10 alkyl group);
    B is at least one selected from the group consisting of a divalent transition metal, a rare earth metal, an alkaline earth metal, Pb, Sn, Ge, Ga, In, Al, Sb, Bi, and Po; and
    X is at least one selected from the group consisting of Cl, Br, and I.

13. The method for manufacturing perovskite nanoparticles of claim 11,
    wherein the alkyl halide is alkyl-X (X is a Cl, Br, or I) or octadecyl ammonium bromide, and wherein the alkyl is an acyclic alkyl including the structure of $C_nH_{2n+1}$, or a structure including alkylamine, p-substituted aniline, phenyl ammonium, or fluorine ammonium.

* * * * *